United States Patent
Yamaguchi et al.

(10) Patent No.: US 8,487,526 B2
(45) Date of Patent: *Jul. 16, 2013

(54) LIGHT EMITTING APPARATUS, SURFACE LIGHT SOURCE APPARATUS AND DISPLAY APPARATUS

(75) Inventors: Masao Yamaguchi, Saitama (JP); Yasuyuki Fukuda, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/483,188

(22) Filed: May 30, 2012

(65) Prior Publication Data

US 2012/0235554 A1    Sep. 20, 2012

Related U.S. Application Data

(63) Continuation of application No. 12/768,108, filed on Apr. 27, 2010, now Pat. No. 8,227,969.

(30) Foreign Application Priority Data

Apr. 27, 2009 (JP) .................................. 2009-107848
Sep. 28, 2009 (JP) .................................. 2009-222574
Apr. 1, 2010 (JP) .................................. 2010-085182

(51) Int. Cl.
*H01J 1/62* (2006.01)
*H01J 63/04* (2006.01)

(52) U.S. Cl.
USPC ........... 313/501; 313/483; 313/500; 313/502; 313/503; 313/504; 313/505; 313/506

(58) Field of Classification Search
None
See application file for complete search history.

(56) References Cited

U.S. PATENT DOCUMENTS

| 7,802,895 | B2 | 9/2010 | Suzuki et al. | |
| 7,927,001 | B2* | 4/2011 | Choi et al. | 362/616 |
| 8,227,969 | B2* | 7/2012 | Yamaguchi et al. | 313/116 |
| 8,283,850 | B2* | 10/2012 | Yamada et al. | 313/504 |

(Continued)

FOREIGN PATENT DOCUMENTS

| CN | 101382609 A | | 3/2009 |
| JP | 2002049326 A | * | 2/2002 |
| WO | 2007114158 A1 | | 10/2007 |

OTHER PUBLICATIONS

English machine translation of KIMURA (JP 2002-049326) Feb. 2002.*

(Continued)

*Primary Examiner* — Natalie Walford
(74) *Attorney, Agent, or Firm* — WASHIDA & associates

(57) ABSTRACT

A light emitting apparatus has a light emitting element arranged on a substrate and a light flux controlling member. The light flux controlling member has: a light control/emission surface that controls a traveling direction of light; a concavity that allows a main beam to be incident inside; and a back surface that extends in a radial direction from an opening rim part of the concavity and that allows sub-beams to be incident inside. One of a grid convex part which arranges a plurality of strips of convex parts in a grid pattern and a grid concave part which arranges a plurality of strips of concave parts in a grid pattern is formed in the back surface of the light flux controlling member. The substrate and the back surface of the light flux controlling member are placed opposite to one another without intervention of a reflective sheet therebetween.

12 Claims, 26 Drawing Sheets

U.S. PATENT DOCUMENTS

2005/0046321 A1* 3/2005 Suga et al. .................. 313/112
2007/0241673 A1* 10/2007 Yamada et al. ............... 313/506
2009/0052192 A1 2/2009 Kokubo et al.
2009/0066892 A1 3/2009 Kumasawa et al.

OTHER PUBLICATIONS

Office Action dated Apr. 3, 2013, for corresponding Chinese Application No. 201010154198.0.

* cited by examiner

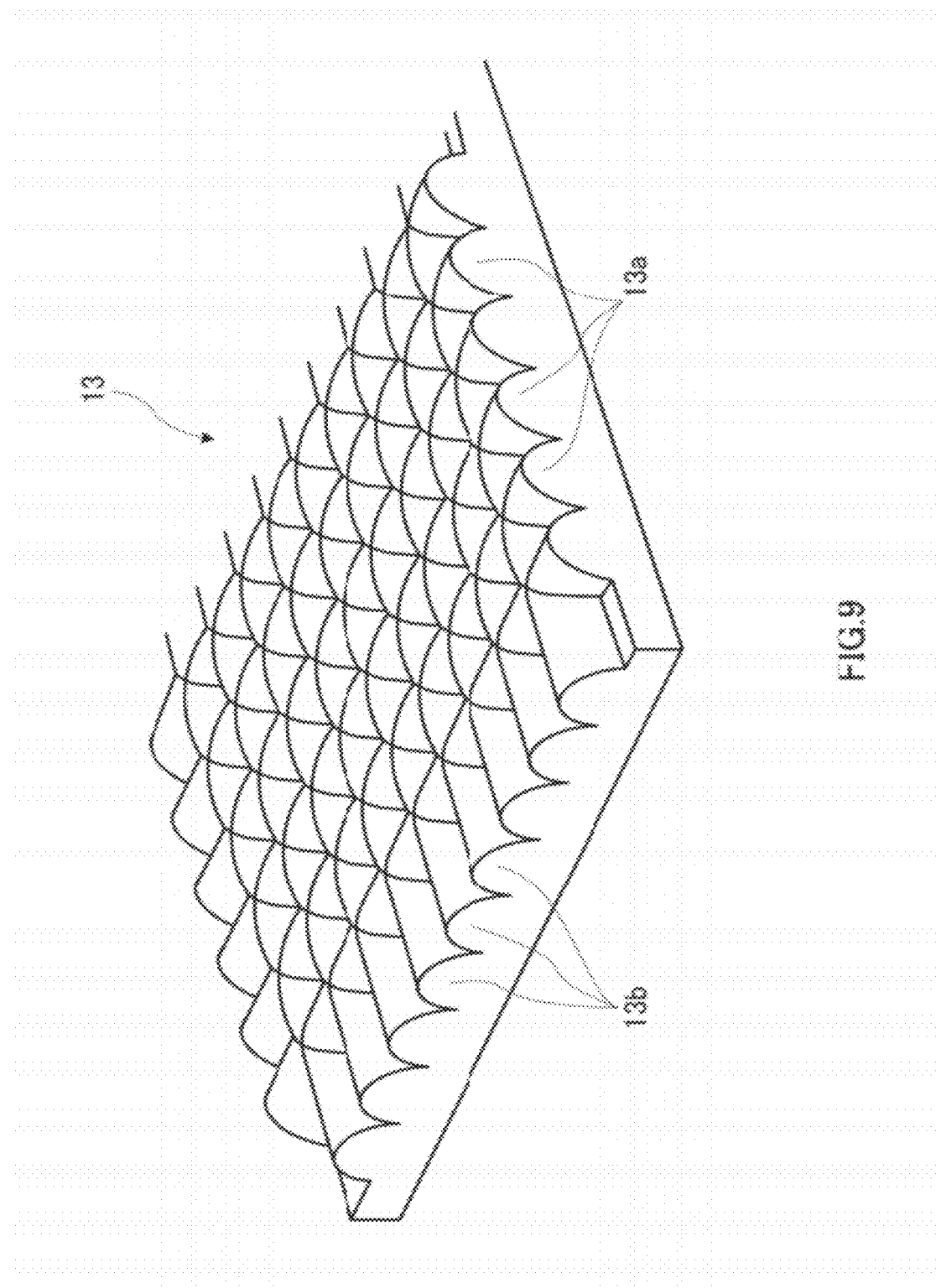

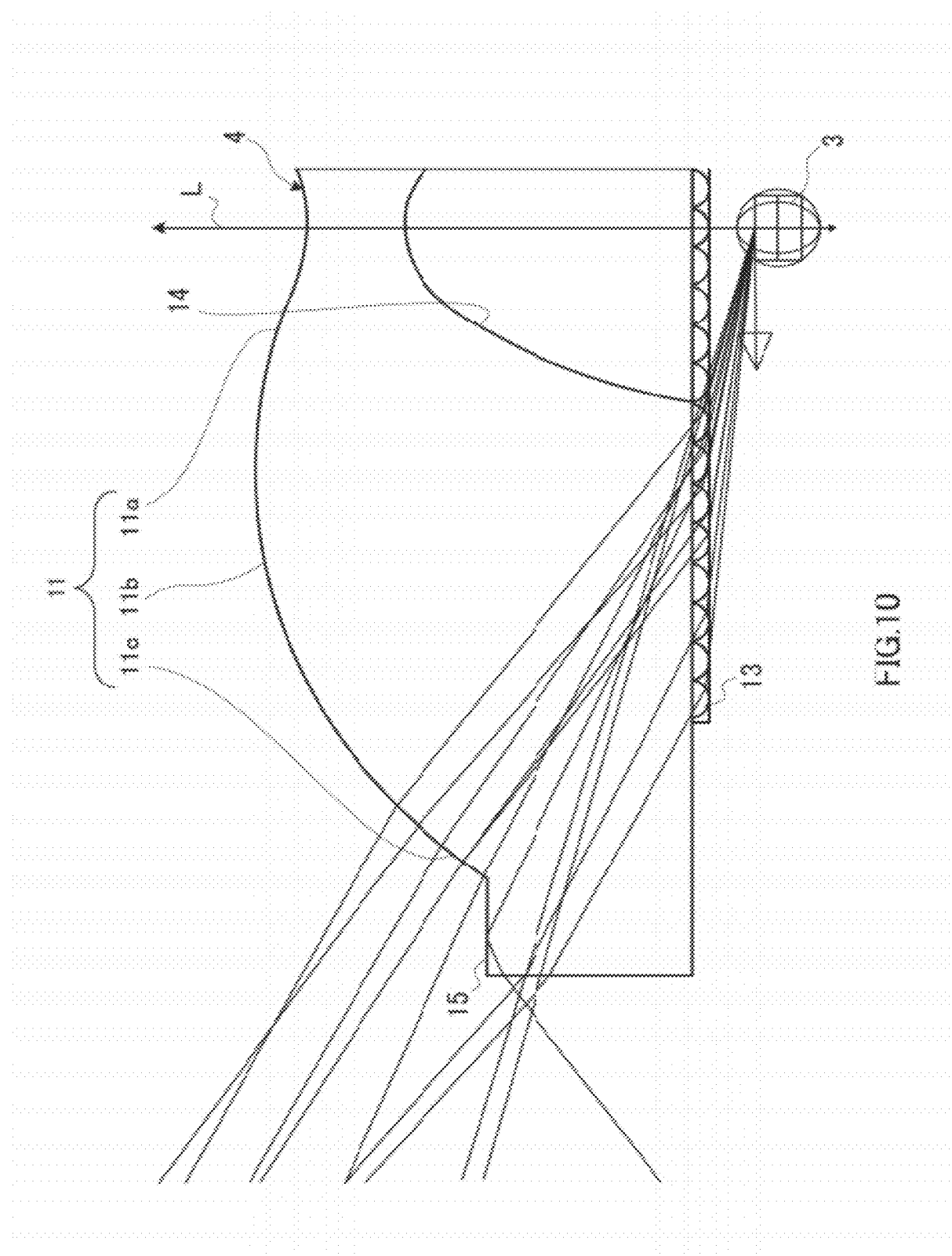

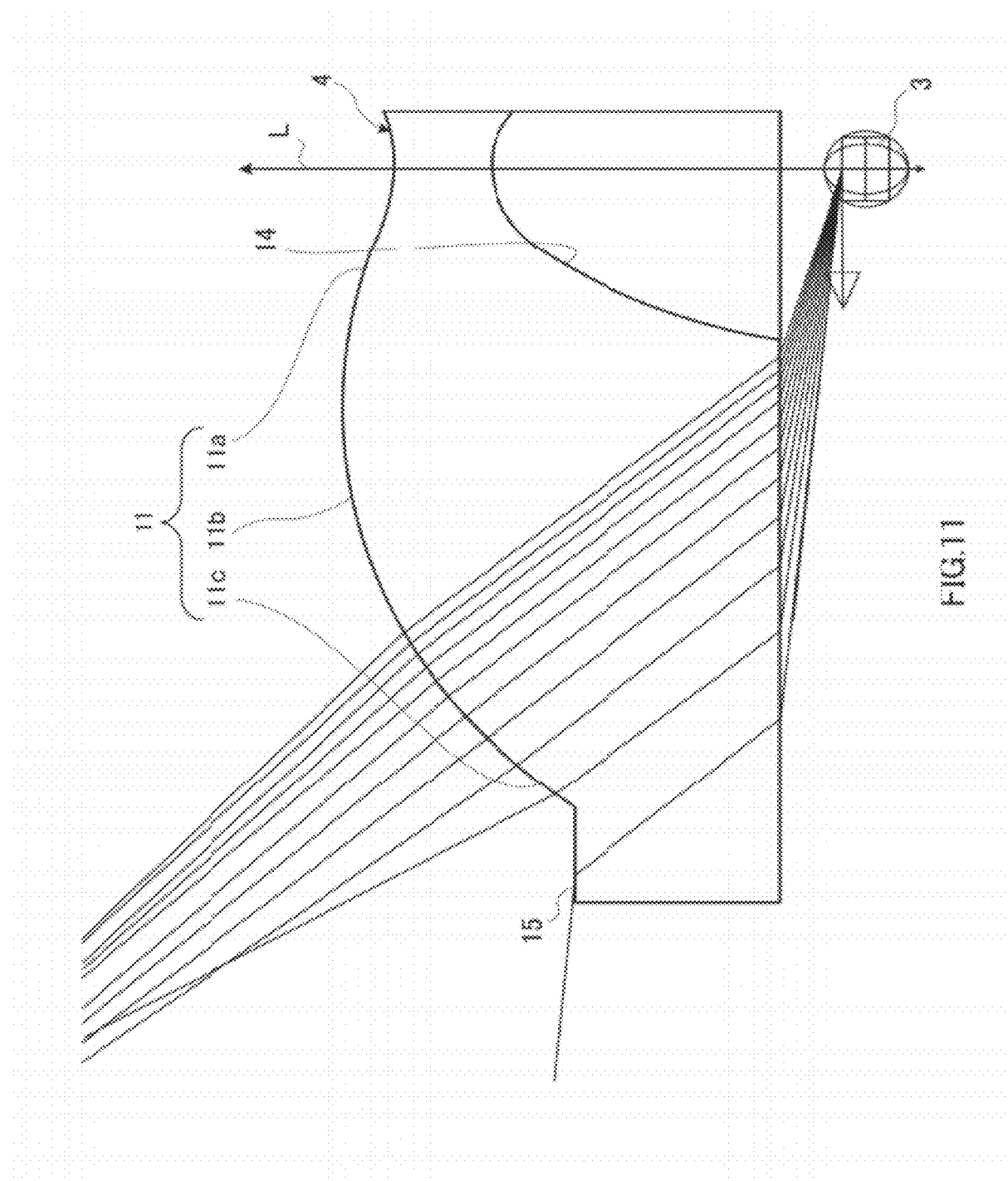

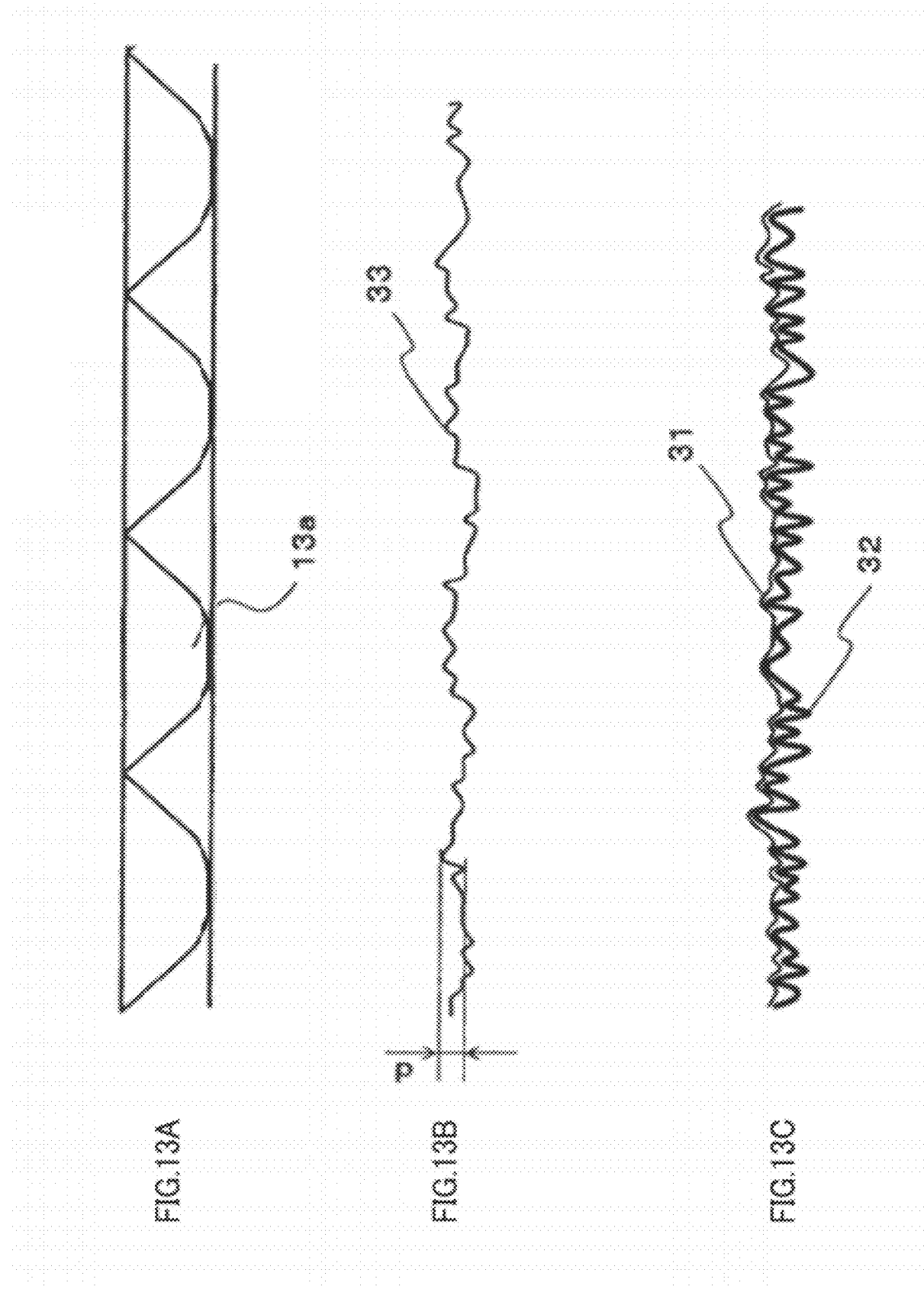

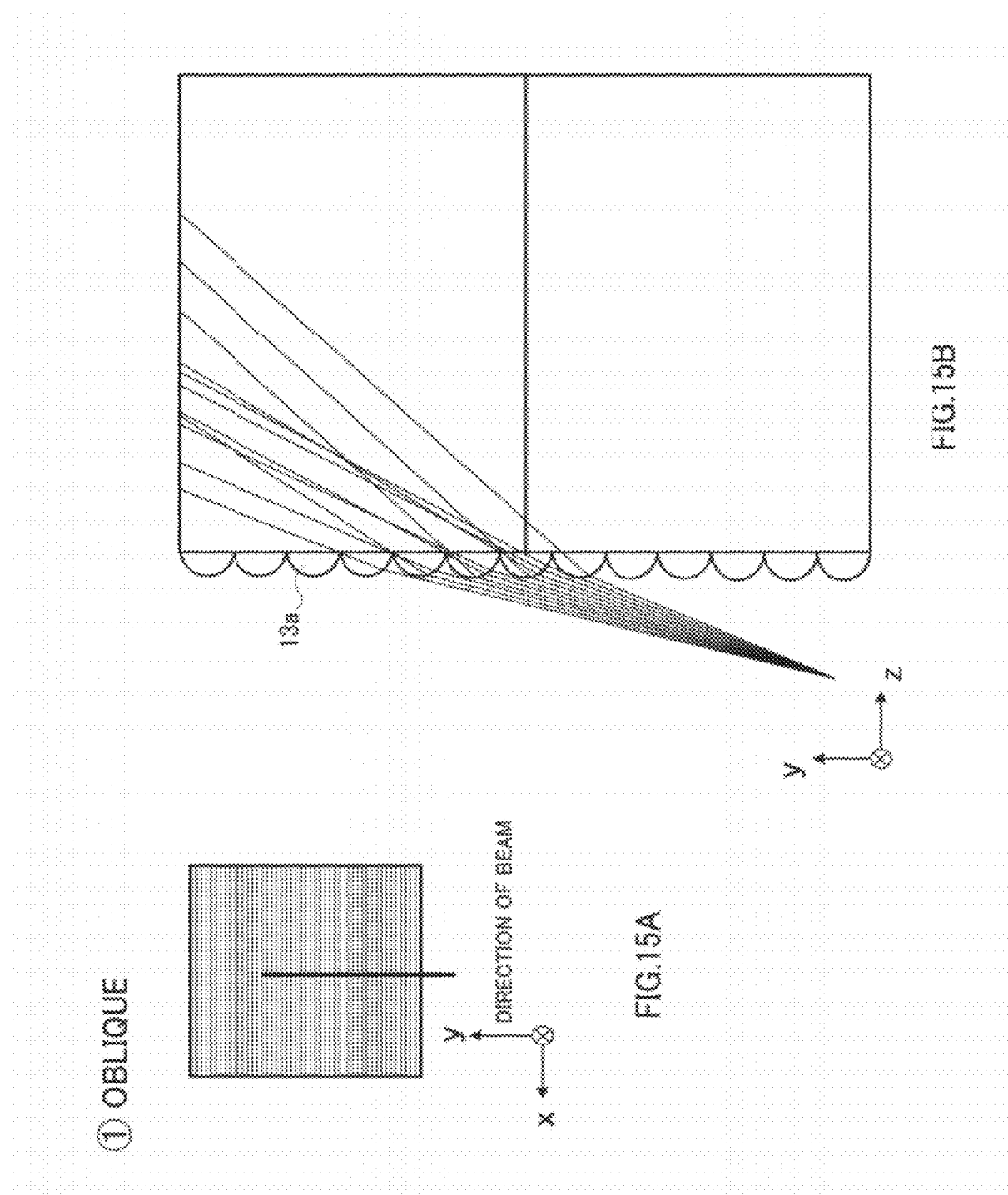

LIGHT EMITTING APPARATUS, SURFACE LIGHT SOURCE APPARATUS AND DISPLAY APPARATUS

CROSS REFERENCE TO RELATED APPLICATIONS

This application is a continuation of U.S. patent application Ser. No. 12/768,108, filed on Apr. 27, 2010 now U.S. Pat. No. 8,227,969, which claims the benefit of Japanese Patent Application No. 2009-107848, filed on Apr. 27, 2009, Japanese Patent Application No. 2009-222574, filed on Sep. 28, 2009, and Japanese Patent Application No. 2010-85182, filed on Apr. 1, 2010, the disclosures of which, including the specifications, drawings and abstracts, are incorporated herein by reference in their entirety.

TECHNICAL FIELD

The present invention relates to a light emitting apparatus, surface light source apparatus and display apparatus. For example, the present invention relates to: a light emitting apparatus used for various illuminations such as light sources of a backlight planarly illuminating a liquid crystal display panel from the back or general illumination in a room; a surface light source apparatus used for various illuminations; and a display apparatus using the surface light source apparatus as an illuminating means in combination with a member-to-be-illuminated.

BACKGROUND ART

Conventionally, a surface light apparatus that uses a plurality of light emitting diodes ("LEDs") as point light sources is known as an illuminating means for a liquid crystal monitor used in a personal computer, television and so on.

The surface light source apparatus arranges a plurality of LEDs in a matrix shape on the back surface of a flat light flux controlling member having virtually the same shape as a liquid crystal panel of a liquid crystal display monitor. The surface light source apparatus allows light emitted from the LEDs to be incident inside the light flux controlling member, and controls the traveling direction of light when emitting light from the light flux controlling member. Then, the surface light source apparatus diffuses light emitted from the light flux controlling member by a light diffusing member, and then planarly illuminates the liquid crystal display panel from the back.

Patent Literature 1 discloses a planar light source from which light having transmitted through an optical element is emitted virtually vertically with respect to the plane surface. FIG. 1 schematically shows a surface light source apparatus that uses as light sources the LEDs disclosed in Patent Literature 1. As shown in FIG. 1, in surface light source apparatus 100, micro lens arrays 102 are arranged to meet a plurality of LEDs 101 on a one-by-one basis. Micro lens arrays 102 control the traveling directions of light emitted from LEDs 101, so that surface light source apparatus 100 emits light in the direction vertical to the plane surface of the substrate (i.e. upward).

Patent Literature 2 discloses a display apparatus in which a hollow part is formed inside a convex part of a lens case and in which void parts with inclining surfaces which reflect light emitted in the horizontal direction from a light emitting element, toward the convex parts, are formed outside the outer periphery of the hollow part.

FIG. 2 is a configuration diagram showing a display apparatus disclosed in Patent Literature 2. As shown in FIG. 2, matrix display apparatus 130 aligns light emitting elements 132 in a matrix shape, on display panel substrate 131, and arranges lens cases 133 on the side of the surface of light emitting elements 132. Lens case 133 is mounted on display panel substrate 131 to be closely attached. In lens case 133, convex part 134 of virtually a semispherical shape is formed in the position meeting light emitting element 132, and hollow part 135 that includes light emitting element 132 inside convex part 134 is formed. The sidewalls of hollow part 135 takes in light emitted from light emitting element 132 by refracting the light such that the light travels toward the front side (i.e. upward in FIG. 2). The sidewalls of hollow part 135 are only the incidence planes for light emitted from light emitting element 132. Further, in lens case 133, void parts 136 are formed around hollow part 135 that includes light emitting element 132. Void parts 136 totally reflect light emitted in the horizontal direction from light emitting element 132 and taken in by lens case 133, toward the front side through inclining surfaces 137 of void parts 136 and insulating substrate 138. By this means, the luminance of illumination light in the front side of matrix display apparatus 130 increases.

CITATION LIST

Patent Literature

Patent Literature 1: Japanese Patent Application Laid-Open No. 2002-49326
Patent Literature 2: Japanese Patent Application Laid-Open No. 2001-250986

SUMMARY OF INVENTION

Technical Problem

However, with this conventional surface light source apparatus, light emitted from a light emitting element is incident on the back surface of a light flux controlling member (i.e. the surface facing the substrate) and the light flux controlling member concentrates and emits this light, and therefore there is a problem that unevenness in illuminance is produced on the illuminated surface. The unevenness in illuminance prevents uniform planar illumination, and deteriorates quality of illumination.

It is therefore an object of the present invention to provide a light emitting apparatus, surface light source apparatus and display apparatus that can prevent unevenness in illuminance.

Solution to Problem

The light emitting apparatus according to the present invention employs a configuration which includes: a light emitting element that is arranged on a substrate and that emits light; and a light flux controlling member that has: a light control/emission surface that controls a traveling direction of light emitted from the light emitting element; a concavity that allows a main beam to be incident inside, the main beam being light emitted in a predetermined range of an angle from a reference optical axis serving as a center axis of three-dimensional light fluxes emitted from the light emitting element; and a back surface that extends in a radial direction from an opening rim part of the concavity and that allows sub-beams to be incident inside, the sub-beams being light other than the main beam emitted from the light emitting element, and in which one of a grid convex part which arranges a plurality of strips of convex parts in a grid pattern and a grid concave part which arranges a plurality of strips of concave parts in a grid pattern, is formed in the back surface of the light flux controlling member.

The surface light source apparatus according to the present invention employs a configuration which includes: the above light emitting apparatus; and a light diffusing member that scatters light and allows transmission of light emitted from the light emitting apparatus.

The display apparatus according to the present invention employs a configuration which includes: the above surface light source apparatus; and a member-to-be-illuminated on which light from the surface light source apparatus is radiated.

Advantageous Effects of Invention

The present invention can scatter light incident on the back surface of a light flux controlling member, out of light emitted from light emitting elements. As a result, it is possible to provide uniform illuminance on the illuminated surface on which light is radiated from the light flux controlling member, and provide high quality of illumination.

BRIEF DESCRIPTION OF DRAWINGS

FIG. 9 is a perspective view schematically showing the structure of a grid convex part by cutting part of the back surface of a light flux controlling member of a surface light source apparatus according to Embodiment 1 of the present invention;

FIG. 10 illustrates the operation of a light flux controlling member forming a grid convex part in the back surface of a light flux controlling member of a surface light source apparatus according to Embodiment 1 of the present invention;

FIG. 11 illustrates the operation of a light flux controlling member forming a smooth surface as the back surface of a light flux controlling member of a surface light source apparatus according to Embodiment 1 of the present invention;

FIG. 13 illustrates convex parts formed in the back surface of a light flux controlling member of a surface light source apparatus according to Embodiment 1 of the present invention;

FIG. 15 illustrates scattered light and convex parts formed in the back surface of a light flux controlling member of a surface light source apparatus according to Embodiment 1 of the present invention;

DESCRIPTION OF EMBODIMENTS

Hereinafter, embodiments of the present invention will be explained in detail with reference to the accompanying drawings.

(Explanation of Principle)

The basic concept of the present invention will be explained.

Figure 1:
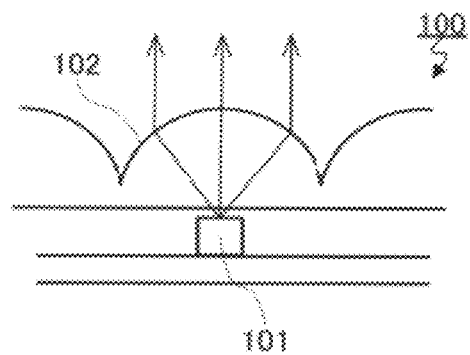
FIG. 1 schematically shows a conventional surface light source apparatus that uses LEDs as light sources.
Figure 2:
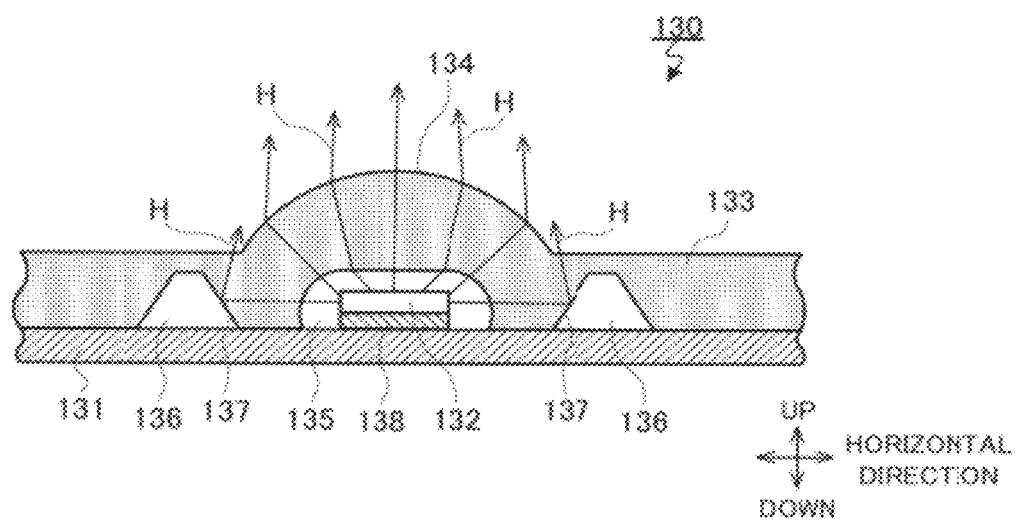
FIG. 2 is a configuration diagram showing a conventional display apparatus.
Figure 3:
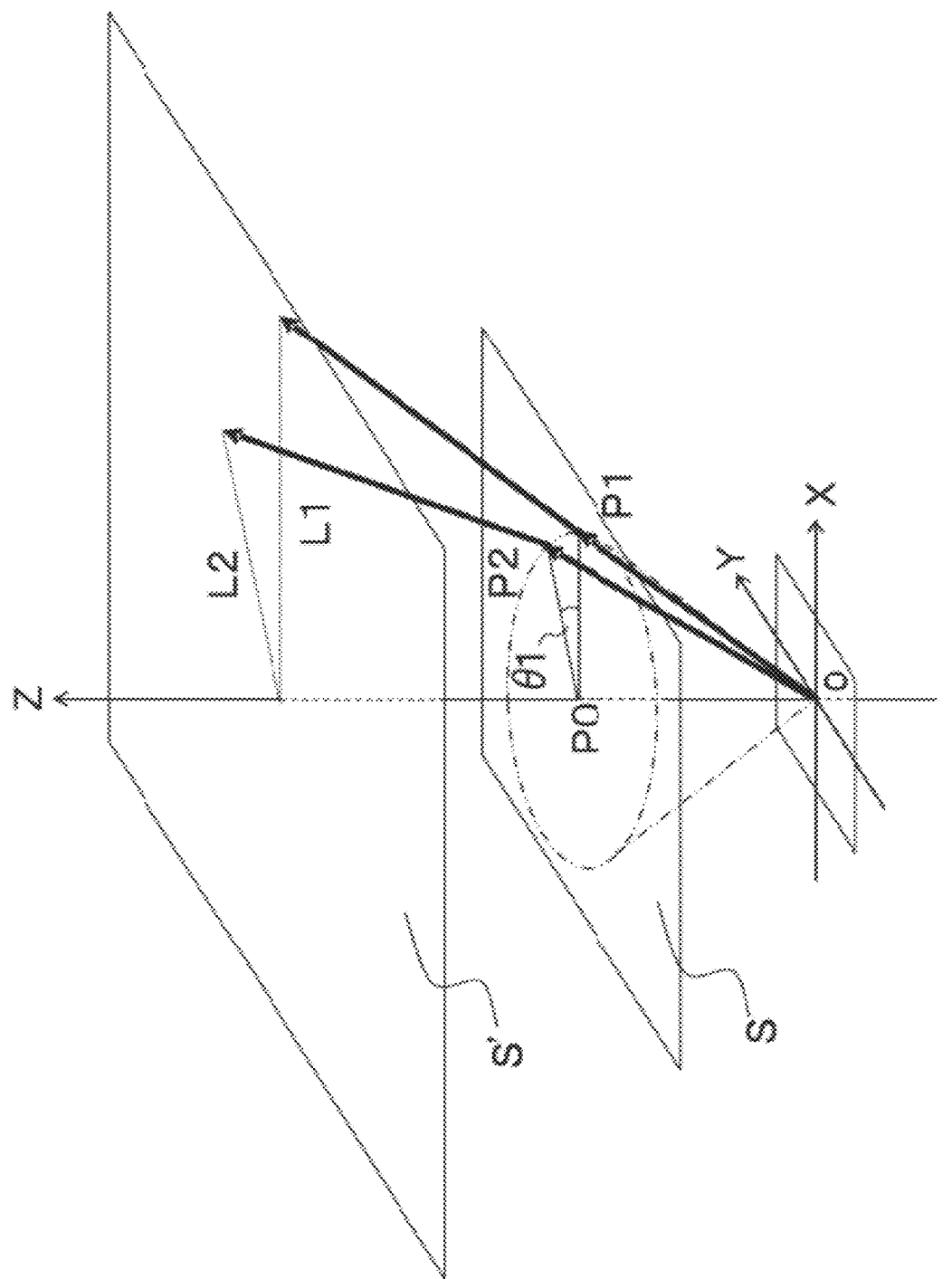
FIG. 3 illustrates the basic principle of the present invention.

FIG. 3 illustrates the basic principle of the present invention.

Conventionally, light incident from the back surface of a light flux controlling member was not taken into account. The present inventors have found based on experiments that, if such light is incident inside a light flux controlling member from the back surface of the light flux controlling member, the light flux controlling member concentrates and emits this light, thereby producing unevenness in illuminance on the illuminated surface. Further, it has been found that it is not possible to prevent unevenness in illuminance from being produced by simply roughening the back surface of the light flux controlling member.

Then, the present inventors have found a configuration to form a grid pattern of a plurality of convex parts or a plurality of concave parts in the back surface of the light flux controlling member, in order to scatter light incident from light emitting elements on the back surface of the light flux controlling member. This configuration has the following characteristics.

FIG. 3 is a coordinate axis which serves as a guide to arrange the light flux controlling member. A light emitting point, which is one spot on the emission plane of a light emitting element, is arranged in origin O in the XYZ orthogonal coordinates, and the back surface of the light flux controlling member is arranged on plane S which is distant apart from origin O and parallel to the X-Y plane, such that the reference optical axis of the light flux controlling member matches the Z axis. In case where the intersection point between the reference optical axis of the light flux controlling member and plane S is point P0, points of incidence of light emitted from origin O are "point P1" on the intersection line between above plane S and a pyramidal plane of a virtual circular cone having origin O as the vertex, and "point P2" rotating point P1 by θ1=45 degrees around the Z axis as the rotation axis. For example, by forming a grid pattern of a plurality of strips of convex parts (i.e. protrusions) or strips of concave parts (i.e. grooves) in the back surface of the light flux controlling member, such that ridge lines extend in the direction orthogonal to line P0-P1, it is possible to allow anisotropic refraction of light emitted from origin O. Further, distance L1 between the reference optical axis and a point on illuminated plane S' which light incident on point P1 reaches and which is parallel to plane S differs from distance L2 between the reference optical axis and a point on illuminated plane S' which light incident on point P2 reaches. By this means, it is possible to prevent an annular, discriminating bright part from being produced on an illuminated surface.

Embodiment 1

[Overall Shape of Surface Light Source Apparatus]

Figure 4:
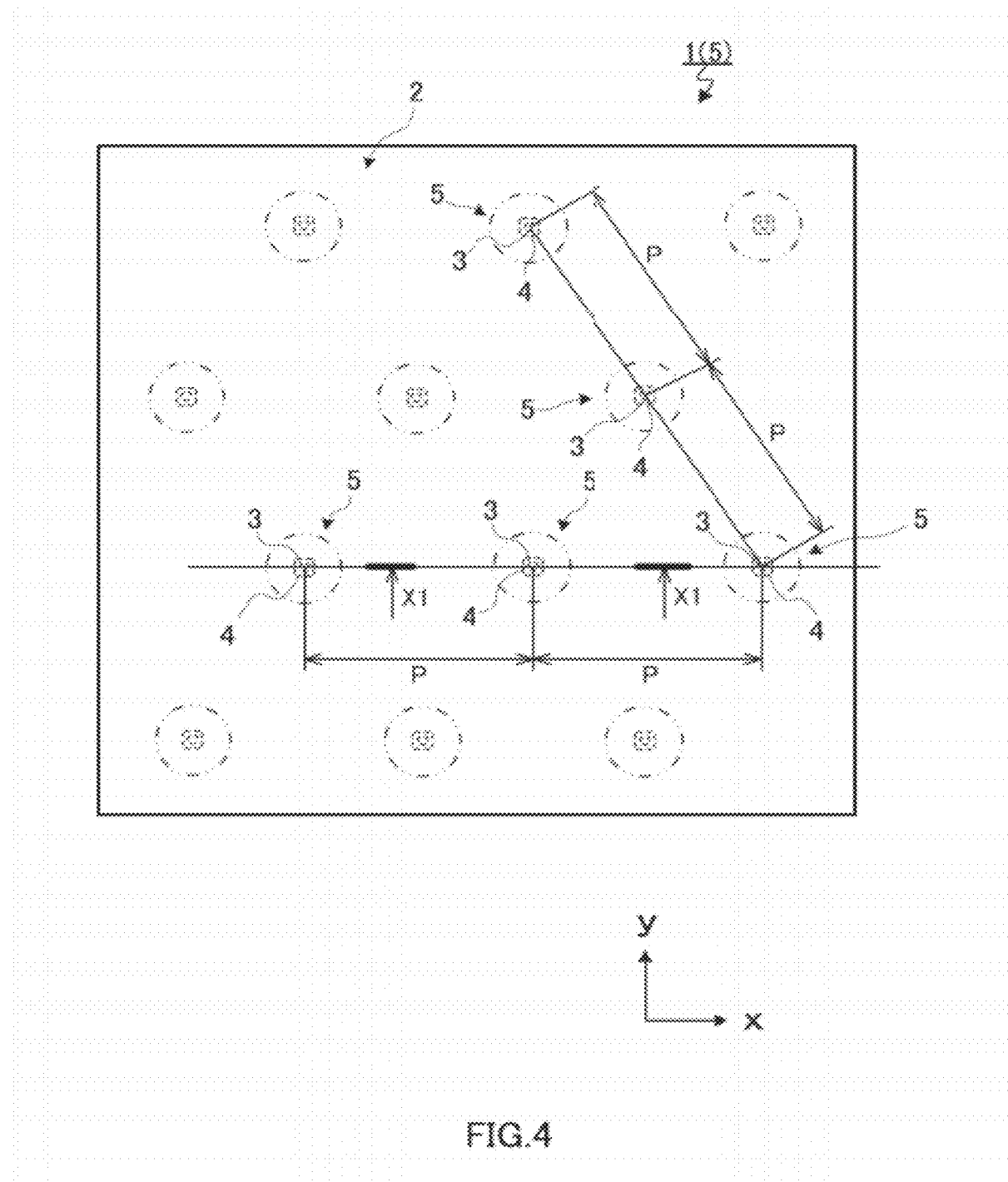
FIG. 4 is a plan view of a surface light source apparatus forming a display apparatus according to Embodiment 1 of the present invention.
Figure 5:
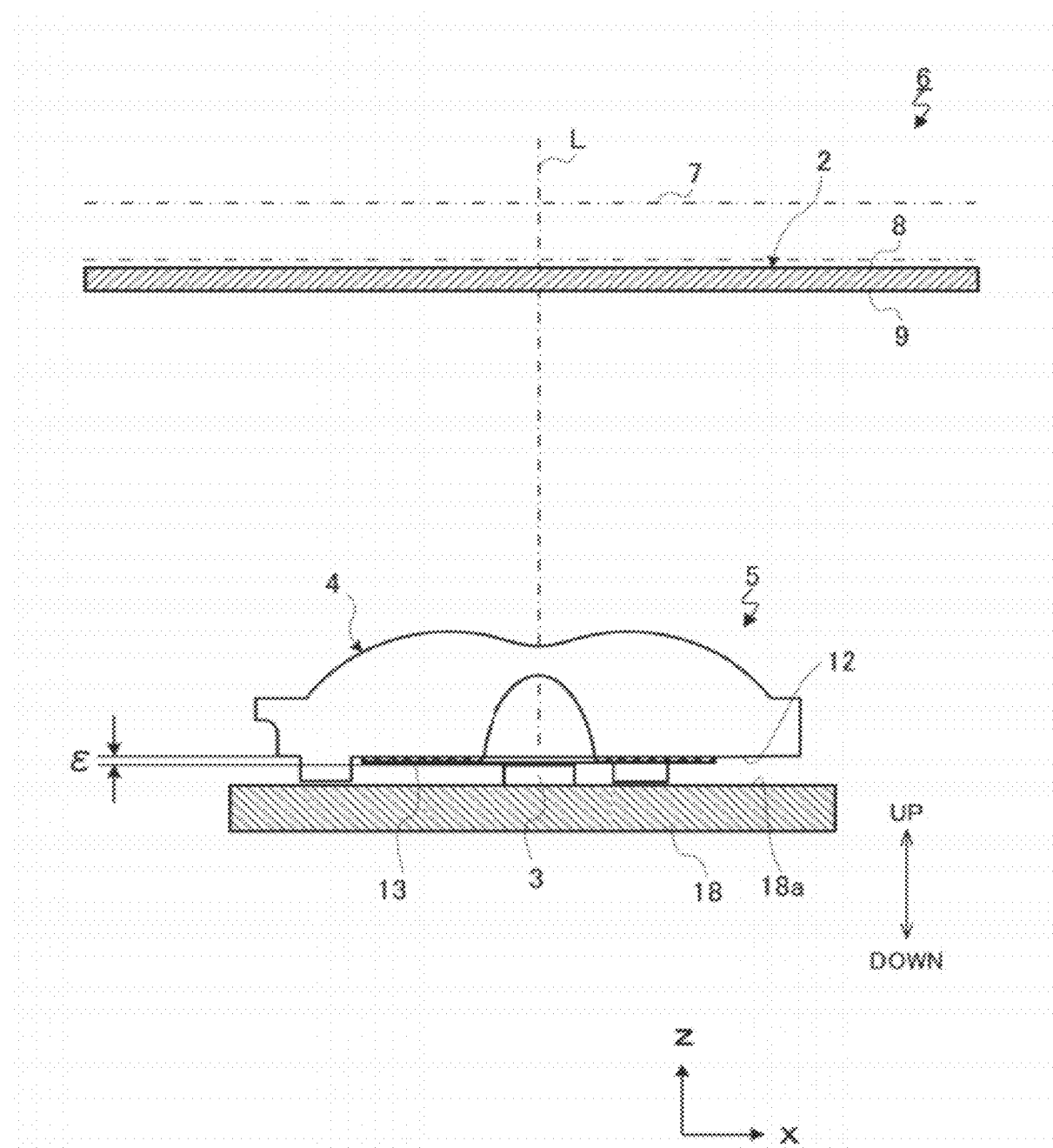
FIG. 5 is a cross-sectional view of a display apparatus cut along line X1-X1 in FIG. 4.

FIG. 4 is a plan view of a surface light source apparatus forming a display apparatus according to Embodiment 1 based on the above basic concept. Note that FIG. 4 does not show a member-to-be-illuminated such as a liquid crystal display panel. FIG. 5 is a cross-sectional view cutting the display apparatus of FIG. 4 along line X1-X1. The present embodiment provides an example where the surface light source apparatus is applied to a liquid crystal panel.

As shown in FIG. 4, surface light source apparatus 1 has flat light diffusing member 2, light emitting elements 3 of light sources and light flux controlling members 4. Light diffusing member 2 is arranged on the back surface of a member-to-be-illuminated such as a liquid crystal display panel, and has virtually the same shape as the member-to-be-illuminated. A plurality of light emitting elements 3 are arranged at virtually equal intervals of pitch P, on the back surface of light diffusing member 2. Light flux controlling members 4 control the traveling directions of light fluxes emitted from light emitting elements 3.

Above light emitting element 3 and light flux controlling member 4 form light emitting apparatus 5.

As shown in FIG. 5, display apparatus 6 is formed with surface light source apparatus 1 and member-to-be-illuminated 7 that is arranged on the side of emission plane 8 (i.e. plane on the opposite side of back surface 9) of light diffusing member 2.

Light diffusing member 2 is formed to have a shape of a sheet or a flat shape by resin material of good optical transparency such as PMMA (PolyMethylMethAcrylate) and PC (PolyCarbonate). Light diffusing member 2 is formed in virtually the same size as the flat shape of a member-to-be-illuminated such as a liquid crystal display panel, advertisement display panel and signpost display panel.

In the surface of light diffusing member 2, minute irregularities (i.e. prism-shaped protrusions or irregularities formed by embossing treatment or diffusion processing such as bead coating) are formed, or a diffusing material is mixed inside light diffusing member 2.

By means of this treatment, light diffusing member 2 diffuses light while allowing transmission of light emitted from light controlling emission surface 11 (see FIG. 6) of light flux controlling member 4, and makes light radiated on the member-to-be-illuminated uniform.

Light emitting elements 3 are, for example, LEDs. Light emitting elements 3 are arranged in a matrix shape, on the back surface of light diffusing member 2.

Light flux controlling member 4 is an expanding lens that controls the traveling directions of light emitted from light emitting elements 3, and is, for example, an aspheric lens. Light flux controlling member 4 is made of transparent resin material such as PMMA (PolyMethylMethAcrylate), PC (Polycarbonate) and EP (EPoxy resin) or transparent glass.

[Overall Shape of Light Flux Controlling Member 4]

Figure 6:
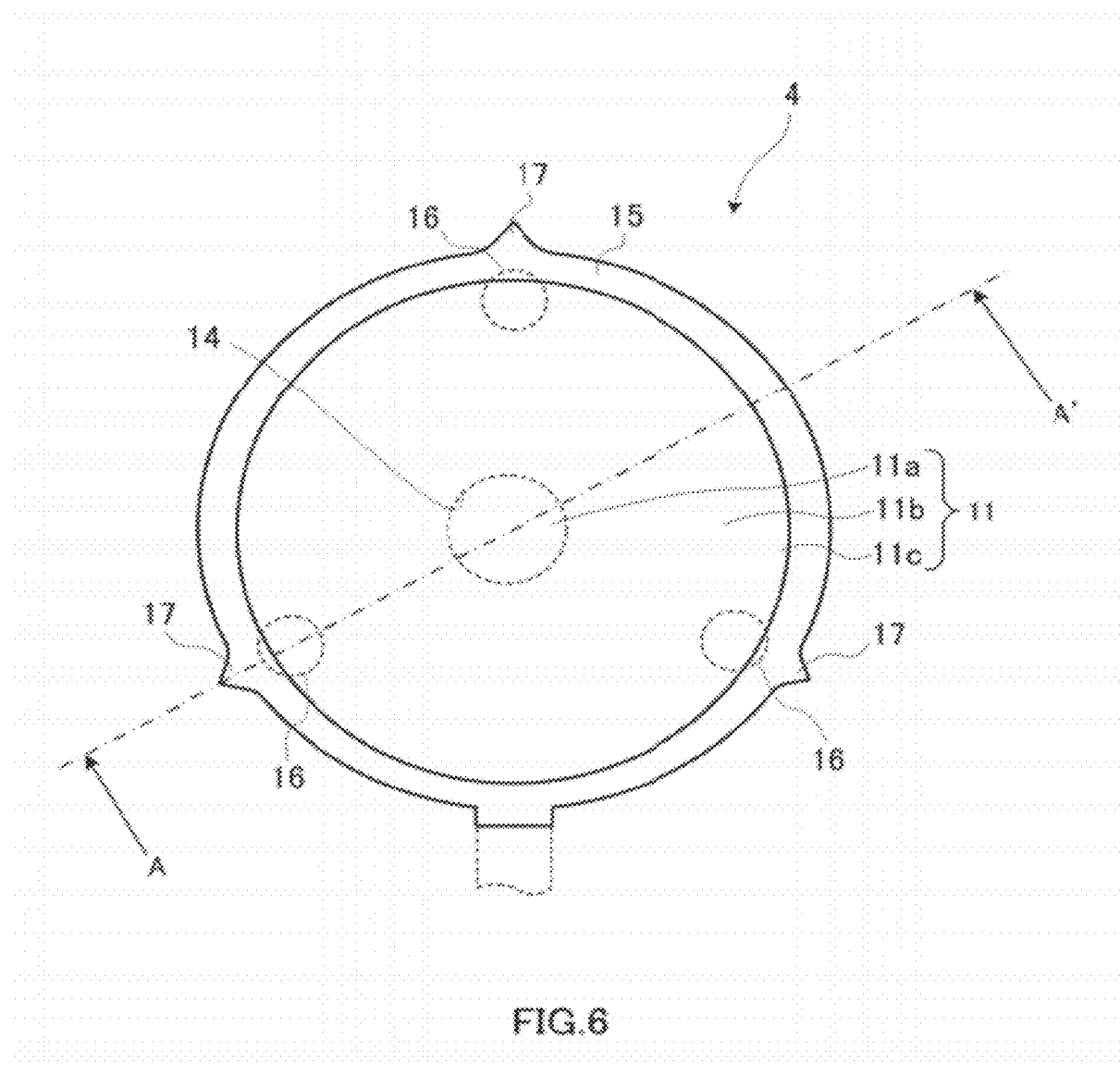
FIG. 6 shows a detailed configuration of a light flux controlling member of a surface light source apparatus according to Embodiment 1 of the present invention.
Figure 7A:
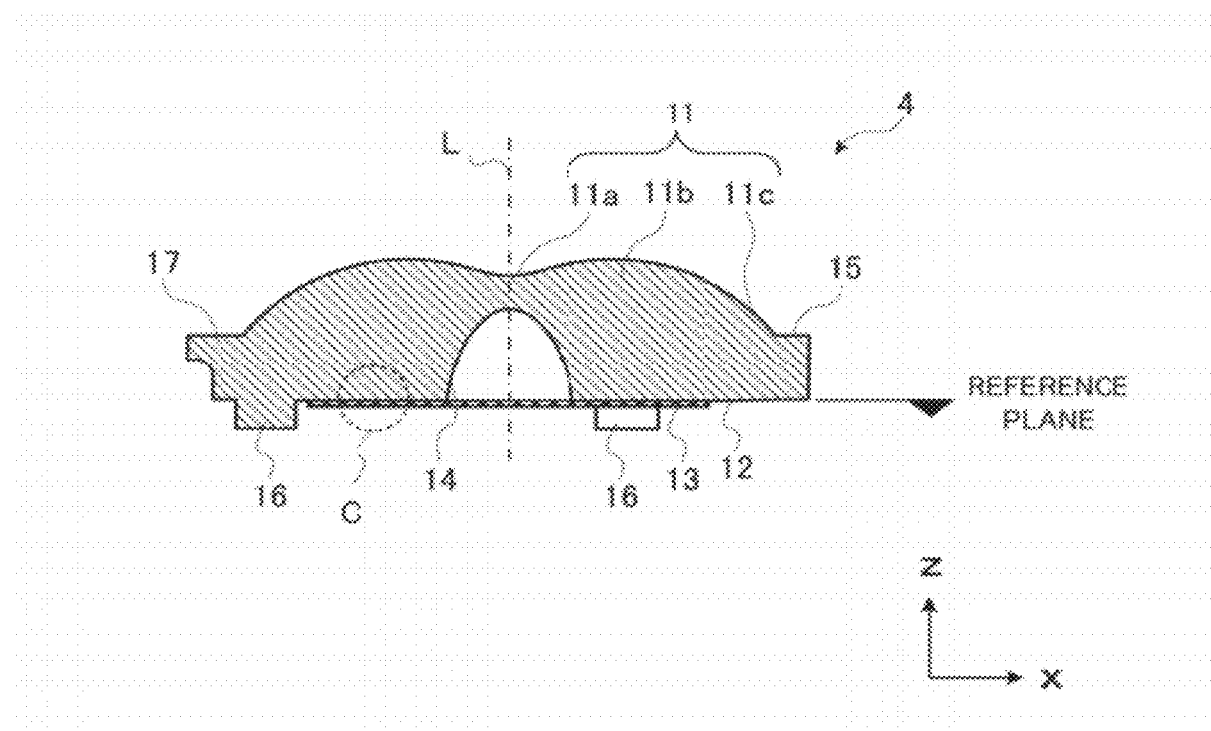
FIG. 7 shows a detailed configuration of a light flux controlling member of a surface light source apparatus according to Embodiment 1 of the present invention.
Figure 7B:
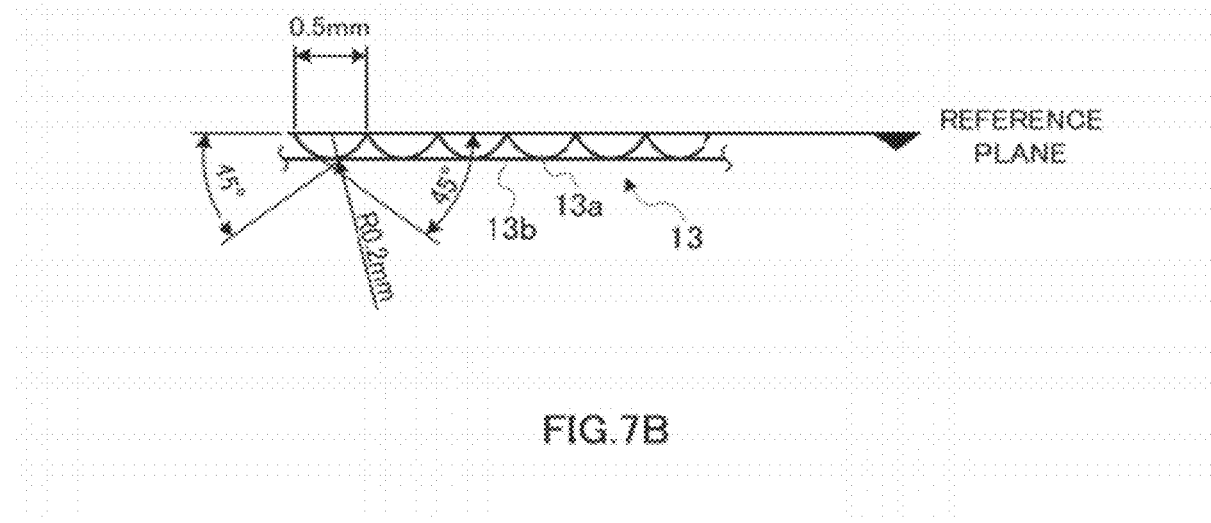
Figure 8:
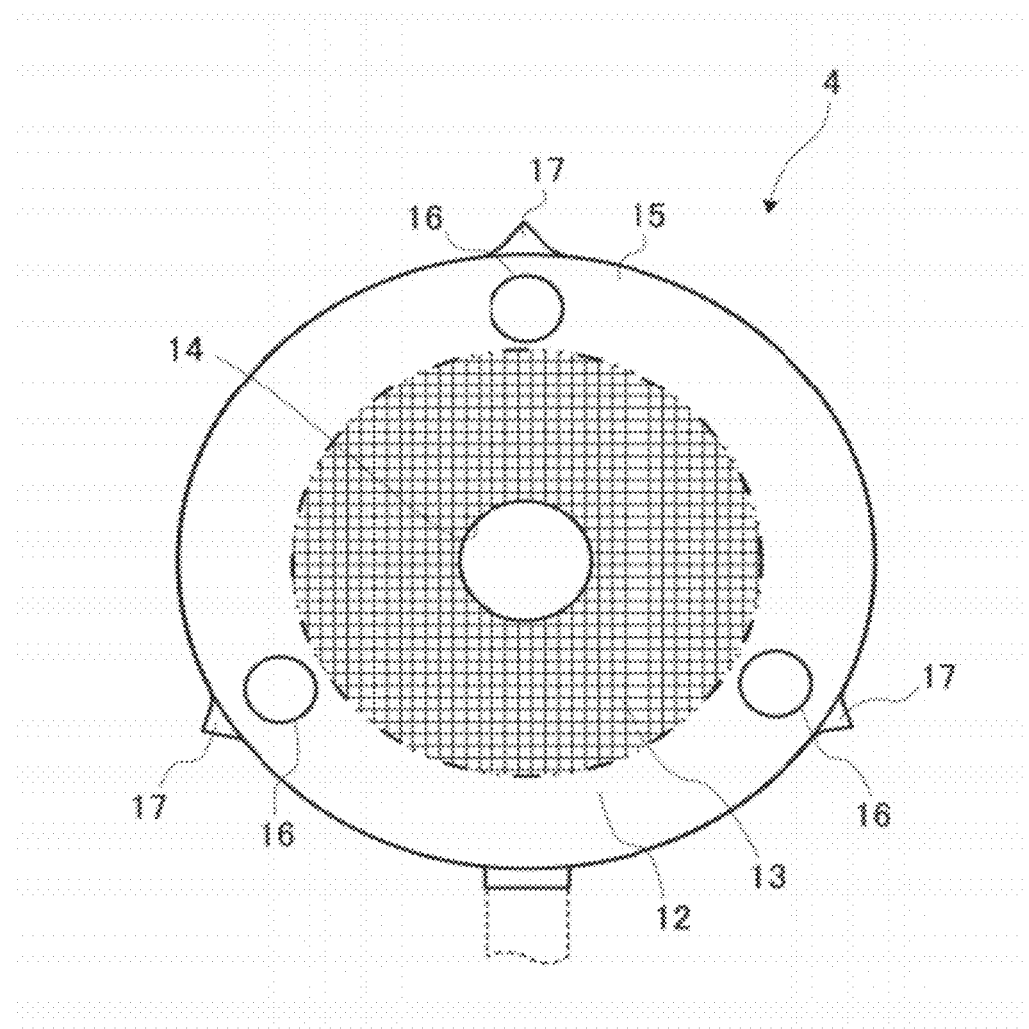
FIG. 8 shows a detailed configuration of a light flux controlling member of a surface light source apparatus according to Embodiment 1 of the present invention.

FIG. 6 to FIG. 8 show the detailed configuration of above light flux controlling member 4. FIG. 6 is a plan view of light flux controlling member 4, FIG. 7A is a cross-sectional view showing FIG. 6 from line A-A' indicated by arrows, FIG. 7B is a view enlarging part C shown in FIG. 7A, and FIG. 8 is a bottom view of above light flux controlling member 4.

FIG. 7 illustrates the shape of light flux controlling member 4 including reference optical axis L of light emitting element 3. Reference optical axis L refers to the traveling direction of light that is a virtual beam representing light fluxes, and that is in the center of three-dimensional light fluxes emitted from light emitting element 3. A case will be explained with the present embodiment where the optical axis of light emitting element 3 (i.e. the optical, center axis of light emitting element 3) matches reference optical axis L.

As shown in FIG. 6 to FIG. 8, light flux controlling member 4 has light controlling emission surface 11, back surface 12 and concavity 14. Light controlling emission surface 11 controls the emission direction to emit light which is emitted from light emitting element 3 and which is incident inside light flux controlling member 4. Concavity 14 allows a main beam, which is light emitted at a predetermined range of angles in the reference optical axis direction out of light emitted from light emitting element 3, to be incident inside. Back surface 12 extends from the opening rim part of concavity 14 in the radial direction, and allows sub-beams, which are light other than the above main beam and which are emitted from light emitting element 3 at a wide angle with respect to the reference optical axis, to be incident inside. In back surface 12, grid convex part 13 that scatters light incident on back surface 12 of light flux controlling member 4 from light emitting element 3 is formed.

Further, light flux controlling member 4 has: flange 15 of virtually an annular shape that projects outward in the radial direction of light controlling emission surface 11; legs 16 of a round stick shape that attach light flux controlling member 4 to substrate 18 (see FIG. 5) in a state where light flux controlling member 4 is positioned in substrate 18; and protrusions 17 that guide the positioning of legs 16.

Light controlling emission surface 11 projects upward above flange 15 (to the side of light diffusing member 2) as shown in FIG. 7A.

Three legs 16 are formed at equal intervals on the circumference of the concentric circle of the inner peripheral surface of flange 15. Protrusions 17 meet the positions of three legs 16, and are formed to project outward in the radial direction of flange 15.

Legs 16 are adhered to surface 18a (see FIG. 5) of substrate 18 in a state where light flux controlling member 4 is positioned with respect to substrate 18, so that light flux controlling member 4 is attached to substrate 18.

When light flux controlling member 4 is attached to substrate 18, gap ϵ is formed between the light emission surface of light emitting element 3 and back surface 12 (i.e. reference plane) of light flux controlling member 4 (see FIG. 5). There are reasons for forming gap ϵ, including a passive reason that there is error of attachment when light flux controlling member 4 is mounted on substrate 18 to accommodate light emitting element 3 in concavity 14, and the positive reason that there is a purpose of releasing heat discharged from light emitting element 3.

[Light Control/Emission Surface 11 of Light Flux Controlling Member 4]

Light control/emission surface 11 of light flux controlling member 4 is formed with: first emission surface 11a that is positioned in a predetermined range around optical axis L; second emission surface 11b that is formed to continue to the periphery of first emission surface 11a; and third emission surface 11c that connects second emission surface 11b with flange 15.

As shown in FIG. 7A, first emission surface 11a has a shape of a smooth curved surface dented downward, and is shaped like a partially removed sphere providing a concave configuration. Further, second emission surface 11b is formed to continue to first emission surface 11a, has a smooth curved shape bulging upward and, when seen from a plan view, is formed in a shape of virtually a hollow disk surrounding first emission surface 11a. Furthermore, third emission surface 11c is formed to continue to second emission surface 11b, and the cross section thereof is formed as virtually a straight inclining surface. Still further, third emission surface 11c may be formed in a curved shape as long as the curved shape does not prevent uniform emission in a wide range from light flux controlling member 4.

[Grid Convex Part 13 of Light Flux Controlling Member 4]

As described above, light flux controlling member 4 is supported on substrate 18 by legs 16, gap ϵ is formed between back surface 12 of light flux controlling member 4 and the light emission surface of light emitting element 3 to radiate heat. This gap ϵ is formed, so that part of light emitted from the light emission surface of light emitting element 3 is incident inside light flux controlling member 4 from back surface 12 of light flux controlling member 4. If back surface 12 is a smooth surface, light reaching back surface 12 of light flux controlling member 4, that is, the lens bottom surface, is refracted closer to reference optical axis L, is incident inside light flux controlling member 4, and is emitted from light control/emission surface 11. This emitting light is not light that cannot be controlled by light flux controlling member 4 to smoothly widen and emit, and that naturally concentrates through smooth back surface 12 and light control/emission plane 12 and produces an annular bright part on the illuminated surface, thereby producing unevenness in illuminance (described later using FIG. 12B).

With the present embodiment, grid convex part 13 is formed in back surface 12 of light flux controlling member 4 to scatter light which is incident on back surface 12 of light flux controlling member 4. That is, between the beam which is incident from arbitrary light incident point P1 on back surface 12 and the beam which is incident from light incident point P2 that is determined by rotating this light incident point P1 45 degrees around reference optical axis L as the axis of rotation, the angle in each light incident point with respect to the normal line of back surface 12 varies. Accordingly, illuminated part (i.e. the trajectory which light reaching the illuminated surface draws on the illuminated surface) acquired by light incident from each point on the trajectory determined by rotating light incident point P1 360 degrees around reference optical axis L as the axis of rotation, does not become annular, and is scattered in a wide range.

The shape of each strip of grid convex part 13 only needs to sufficiently scatter light incident on back surface 12 of light flux controlling member 4, the cross-sectional shape orthogonal to the direction in which the protrusions extend may have a triangular shape, a triangular shape having its vertex subjected to R-chamfer processing, or a semi-circular shape, and, moreover, groove parts between these strips may have round shapes. Further, although, if the transferability for transferring light flux controlling member 4 from the mold is taken into account, each protruding part of grid convex part 13 preferably has a curved shape, a triangular cross-sectional shape is desirable for the purpose of preventing refraction of light in the optical axis direction. Furthermore, the present inventors have found based on experiments that it is preferable to arrange convex parts in a grid pattern to sufficiently scatter light incident on back surface 12 of light flux controlling member 4.

As shown in FIG. 7A and FIG. 8, grid convex part 13 is formed in back surface 12 of light flux controlling member 4. Characteristics of grid convex part 13 include that (1) grid convex part 13 has convex parts and (2) is formed in a grid pattern.

(1) Convex Part

As shown in FIG. 7B, grid convex part 13 is formed by aligning a plurality of strips of convex parts 13a projecting outward from back surface 12 of light flux controlling member 4 such that the ridge lines of these convex parts 13a become parallel, and by aligning a plurality of strips of convex parts 13b (see FIG. 9 described later) orthogonal to those convex parts 13a such that the ridge lines of these convex parts 13b become parallel. The cross-sectional shape of convex part 13a orthogonal to the direction in which a strip extends has a similar shape to a semi-circle, and has a triangular shape having its apex subjected to R-chamfer processing. For example, the length of the bottom surface of convex part 13a is 0.5 millimeters, the base angle of the inclining surface forming a strip is 45 degrees and R at the tip is 0.2 millimeters. Although the inclining angle of convex part 13a may be smaller than 45 degrees, the inclining angle of convex part 13a is preferably 45 degrees or greater for the purpose of scattering light incident on back surface 12 of light flux controlling member 4.

Grid convex part 13 is transferred from the mold using transparent resin material such as PMMA, PC and EP, to back surface 12 of light flux controlling member 4, and is formed integrally with the main body of light flux controlling member 4. Therefore, if the inclining angle of convex part 13a is great, there is a possibility that it is necessary to facilitate transferring by applying high temperature to resin or a mold or by applying dwelling sufficiently to prevent a sink mark in order to achieve accurate transferring required upon molding, and therefore time is required for cooling or dwelling and cost increases.

With the present embodiment, by making the cross-sectional shape of convex part 13a virtually a semi-circular shape, grid convex part 13 can sufficiently scatter light incident on back surface 12 of light flux controlling member 4, and facilitate transferring from the mold upon molding of light flux controlling member 4 to reduce the manufacturing cost.

(2) Grid Pattern

As shown in FIG. 8, grid convex part 13 is formed with the above plurality of convex parts 13a and convex parts 13b orthogonal to these convex parts 13a (see FIG. 9 described later). Here, grid convex part 13 only needs to be provided in a predetermined area from the center of back surface 12 of light flux controlling member 4 to the outer periphery. In FIG. 8, grid convex part 13 is formed almost up to the inner periphery of legs 16. Grid convex part 13 may be formed in the entire surface of back surface 12 of light flux controlling member 4.

FIG. 9 is a perspective view schematically showing a structure by cutting part of grid convex part 13.

As shown in FIG. 9, grid convex part 13 is formed by making a plurality of convex parts 13a and a plurality of convex parts 13b having virtually a semicircular cross-sectional shape orthogonal to each other in a grid pattern. In case where convex parts are formed in a grid pattern and thereby a circular cone symmetrical to reference optical axis L which assumes one point on the light emission surface of light emitting element 3 as the vertex is virtually arranged, such that the bottom surface of this circular cone overlaps back surface 12 of light flux controlling member 4, the shape formed by connecting intersection points between back surface 12 and beams that are emitted from the vertex of the circular cone and that travel along the pyramidal plane, matches the shape of the periphery (i.e. circular shape) of the bottom surface of the circular cone. However, the shape formed on the illuminated surface of member-to-be-illuminated 7 by the intersection points between member-to-be-illuminated 7 and beams emitted from light flux controlling member 4 after having passed the above intersection points does not become circular. Accordingly, it is possible to scatter light incident on back surface 12 of light flux controlling member 4, in either the vertical direction or the horizontal direction. By contrast with this, if the above convex parts are provided in a radial pattern from the center rather than in a grid pattern, or protrusions of a circular conical shape are formed at uniform pitches, there are cases where a strong concentrated light pattern having regularity is produced on the illuminated surface, and there are possibilities that light concentrates in a narrow range on the illuminated surface, thereby producing a discriminating bright part.

Further, when the convex parts are formed in a grid pattern, the illuminance value of the bright part is low compared to the case where back surface 12 is smooth. As described above, by forming convex parts in a grid pattern, it is possible to readily process a mold required to transfer a shape for scattering light sufficiently, by means of injection molding and, consequently, reduce manufacturing cost.

[Operation of Light Flux Controlling Member 4]

Hereinafter, the operation of light flux controlling member 4 configured as described above will be explained.

Figure 12A:
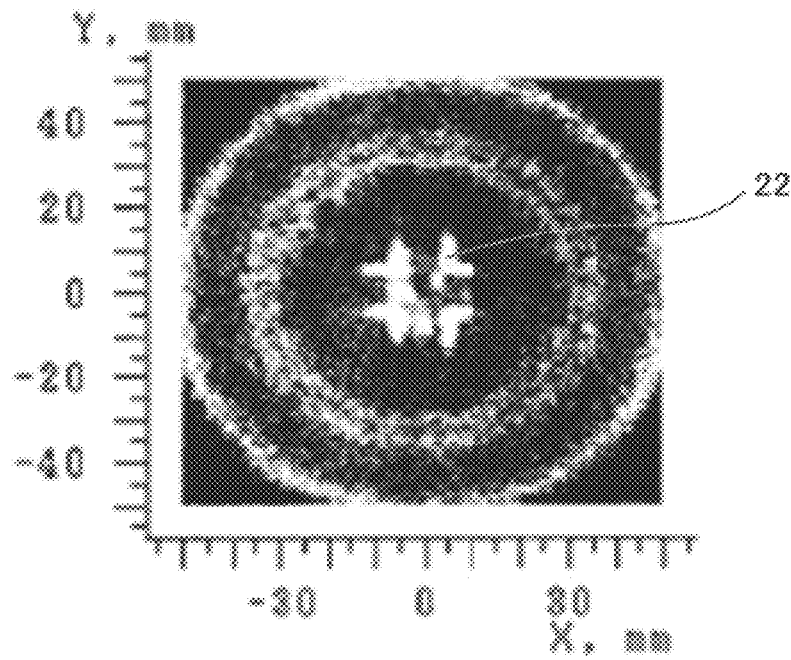
FIG. 12 shows the distribution of illuminance of light on an illuminated surface of a light flux controlling member of a surface light source apparatus according to Embodiment 1 of the present invention.
Figure 12B:
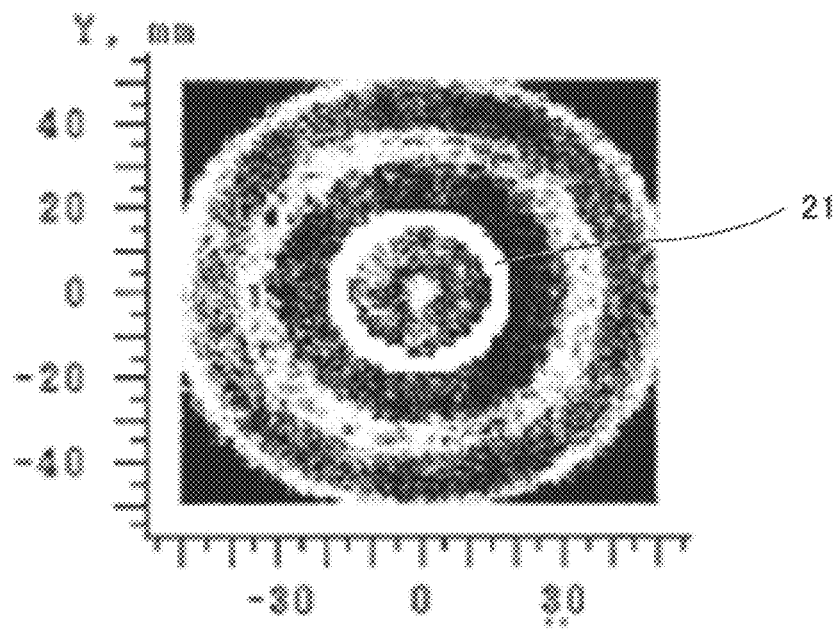

FIG. 10 illustrates the operation of light flux controlling member 4 forming grid convex part 13 in back surface 12 of light flux controlling member 4. FIG. 11 illustrates the operation of light flux controlling member 4 forming back surface 12 of light flux controlling member 4 as a smooth surface (that is, a smooth surface in which grid convex part 13 is not formed). FIG. 12 shows the distribution of illuminance of light on a surface illuminated by light emitted from light flux controlling member 4, that is, the distribution of illuminance on the back surface (i.e. illuminated surface) of light diffusing member 2. As a comparison example of Embodiment 1, FIG. 12A shows the distribution of illuminance of light on the surface illuminated by light radiated from light flux controlling member 4 in which grid convex part 13 of FIG. 10 is formed, and FIG. 12B shows the distribution of illuminance of light on the surface illuminated by light radiated from light flux controlling member 4 forming back surface 12 of FIG. 11 as a smooth surface. The vertical axis and horizontal axis each represent the dimensions from reference optical axis L of light emitting apparatus 5.

First, as shown in FIG. 10 and FIG. 11, most of light in the range covering a half-intensity-angular-range of light emitted from light emitting element 3 is incident on light flux controlling member 4 from concavity 14, transmits inside light flux controlling member 4 and then is outputted to the outside (i.e. in the air) from first emission surface 11a to third emission surface 11c according to Snell's law. At this time, light fluxes emitted from light flux controlling member 4 smoothly spread in the range of illumination.

However, gap $\epsilon$ is formed between substrate 18 (see FIG. 5) and back surface 12 of light flux controlling member 4, and therefore light enters this gap $\epsilon$ from the light emission surface of light emitting element 3 and is incident inside light flux controlling member 4 from back surface 12 of light flux controlling member 4.

As shown in FIG. 11, if back surface 12 of light flux controlling member 4 is a smooth surface, that is, if grid convex part 13 is not formed in light flux controlling member 4, light incident on back surface 12 (i.e. lens bottom surface) of light flux controlling member 4 travels inside light flux controlling member 4 in a state where light is refracted closer to the reference optical axis L, and is emitted from second emission surface 11b and third emission surface 11c. As a result, refraction in the incidence plane to light flux controlling member 4 and concentration of light by the emission plane of a convex lens shape of light flux controlling member 4 produce annular unevenness in illuminance 21 on the illuminated surface in which the part (i.e. luminous part) where light is concentrated is lighted up annularly and more brightly than other parts. Annular unevenness in illuminance 21 is seen from the side of the emission plane of light diffusing member 2, and deteriorates quality of illumination.

By contrast with this, with the present embodiment, light incident on back surface 12 of light flux controlling member 4 is scattered by forming grid convex part 13 in back surface 12 of light flux controlling member 4.

As shown in FIG. 10, if grid convex part 13 is formed in back surface 12 of light flux controlling member 4, in order to scatter light by grid convex part 13, light incident on back surface 12 (i.e. lens bottom surface) of light flux controlling member 4 is emitted from light flux controlling member 4 in a wide range of the illuminated surface without being concentrated closer to reference light axis L. As a result, as shown in FIG. 12A, unevenness in illuminance 22 on the illuminated surface is reduced significantly. Although, in FIG. 12A, the phrase "unevenness in illuminance 22" is used for ease of explanation, the difference in light intensity is actually small and needs not to be referred to as "unevenness in illuminance 22" given the level of the difference. Further, for unevenness in illuminance 22, not only the difference in light intensity is suppressed substantially little compared to annular unevenness in illuminance 21 of FIG. 12B, but also bright parts are discrete as shown in FIG. 12A, so that parts (i.e. bright parts) where light gathers is distributed in a state where unevenness in illuminance is less distinct. Unevenness in illuminance 22 of FIG. 12A shows a discrete cross shape because grid convex part 13 has a square grid.

By the way, if the optical path of light incident from back surface 12 of light flux controlling member 4 can be scattered, it is possible to provide the same advantage as the present embodiment. However, the present inventors have found based on experiments that a mere diffusing surface cannot provide a sufficient advantage.

As a general method of diffusing light, forming a rough surface in back surface 12 of light flux controlling member 4 is possible. A rough surface can readily be created by applying etching processing to the surface which becomes a mold of light flux controlling member 4 and roughening the surface.

FIG. 13 illustrates convex parts formed in back surface 12 of light flux controlling member 4. FIG. 13A shows convex parts of grid convex part 13. Further, FIG. 13B shows back surface 12 to which surface roughening processing is applied. Furthermore, FIG. 13C shows the surface of the mold which is roughened to form a rough surface in back surface 12, and back surface 12 to which the shape of the roughened surface is transferred.

As shown in FIG. 13C, with surface roughening processing using a popular etchant, transfer surface 31 formed in the mold is very fine (i.e. in units on the order of micrometers). By applying such fine treatment processing to back surface 12 of light flux controlling member 4, it is not possible to sufficiently scatter incident light. However, further adding these fine irregularities to grid convex part 13 of the present embodiment shows an effect of further diffusing light. This will be described later in Embodiment 2.

In case where light flux controlling member 4 is transferred from transfer surface 32 of the mold and formed by injection molding and so on, if the temperature setting or dwelling applied to the resin and mold are not appropriate, back surface 12 of light flux controlling member 4 provides irregular treated surface 31 much smoother than fine irregularities on transfer surface 32 of the mold and therefore it becomes impossible to scatter incident light sufficiently. Performing more accurate transferring from transfer surface 32 of the mold makes the molding cycle longer and requires substantial time and adjustment, thereby increasing cost.

If height d of rough surface 33 of FIG. 13B is made as high as convex part 13a of grid convex part 13 of FIG. 13A by performing surface roughening processing using a special etchant or file, it is possible to scatter incident light. However, the present inventors have found that this surface roughening processing has the following drawback in addition to the increase in cost. That is, while the surface roughening processing applied to back surface 12 of light flux controlling member 4 needs to provide a sufficient amount of difference in height d in one convex part of rough surface 33, transferring becomes insufficient if the molding cycle of rough surface 33 shown in FIG. 13B is made a little shorter, and therefore it is not possible to provide the required amount of difference in height d. For the same reason as in the case where back surface 12 of light flux controlling member 4 is a smooth surface, in rough surface 33 that does not provide such sufficient difference in height d, light radiated from the light emission surface of light emitting element 3 is refracted closer to reference optical axis L on back surface 12 (i.e. lens bottom surface) of light flux controlling member 4. Accordingly, after this light is emitted from light flux controlling member 4 and is concentrated on the illuminated surface, thereby producing unevenness in illuminance.

As described above, general surface roughening processing cannot sufficiently scatter optical paths of light incident from back surface 12 of light flux controlling member 4. Even though surface roughening processing for general use can form convex parts, optically speaking, this surface roughening processing produces the same unevenness in illuminance as in the case where back surface 12 is a smooth surface.

Therefore, with the present embodiment, as shown in FIG. 13A, instead of surface roughening treatment for forming a processed surface with a little difference in height using an etchant or file, grid convex part 13 is accurately formed in back surface 12 of light flux controlling member 4.

[Explanation of Convex Parts and Scattered Light]

Figures 14A, 14B:
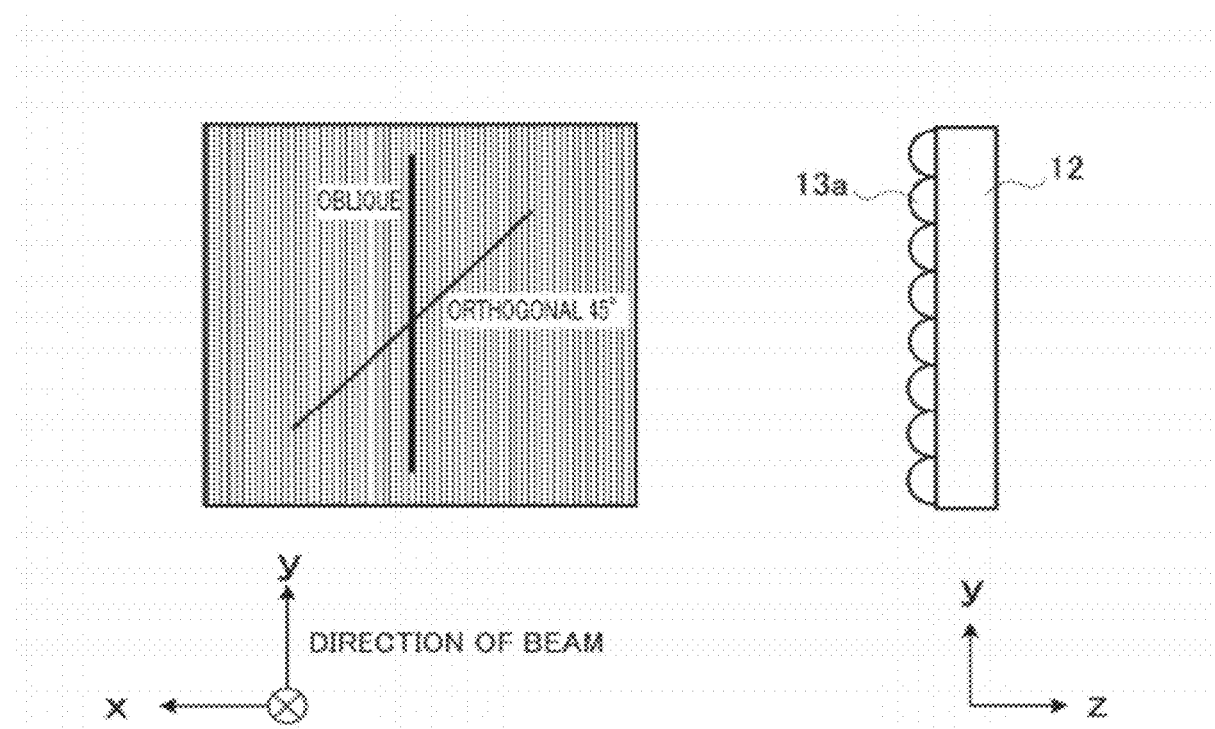
FIG. 14 illustrates scattered light and convex parts formed in the back surface of a light flux controlling member of a surface light source apparatus according to Embodiment 1 of the present invention.
Figure 16A:
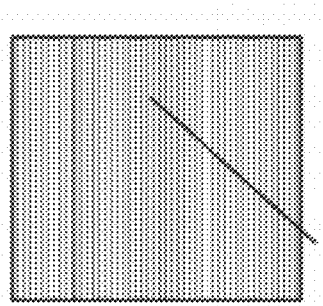
FIG. 16 illustrates scattered light and convex parts formed in the back surface of a light flux controlling member of a surface light source apparatus according to Embodiment 1 of the present invention.
Figure 16B:
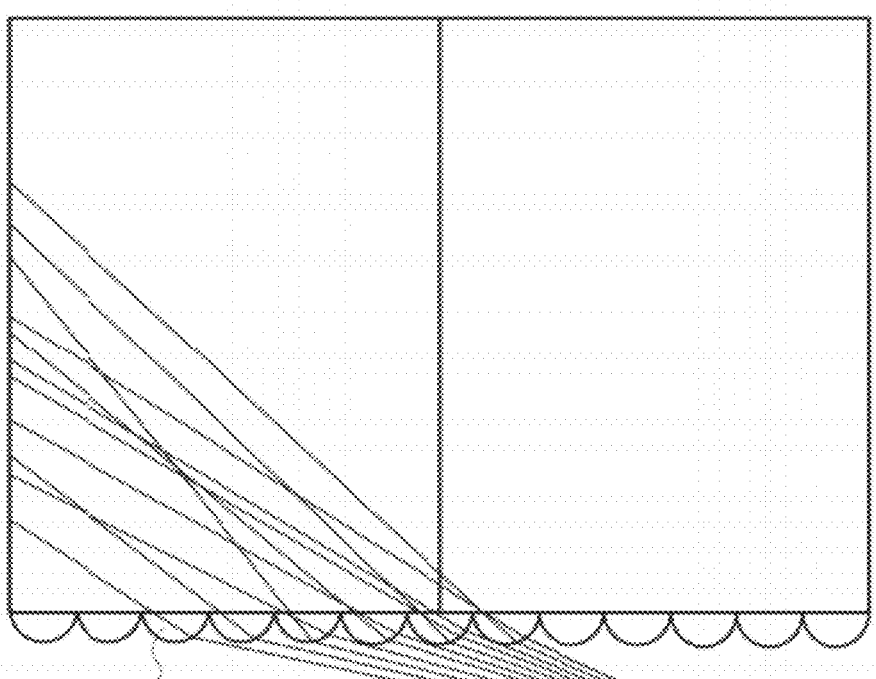

FIG. 14 to FIG. 16 illustrate convex parts 13a formed in back surface 12 of light flux controlling member 4 and scattered light of light incident on the convex parts. FIG. 14A shows the direction of beam seen from the side of back surface 12 where a beam is incident on back surface 12 in case where convex parts 13a are formed in back surface 12 of light flux controlling member 4 such that convex parts 13a are parallel to the X axis of the XYZ orthogonal coordinates. Further, FIG. 14B schematically shows the shape in FIG. 14A seen from the lateral side (i.e. from the X axis direction). FIG. 15A shows the direction of beam incident from the orthogonal direction on convex parts 13a of back surface 12 of light flux controlling member 4 shown in FIG. 14A. Further, FIG. 15B shows that the operation of convex parts 13a of back surface 12 of light flux controlling member 4 works on beams incident from the orthogonal direction. FIG. 16A shows the direction of beam incident from the oblique direction of 45 degrees on convex parts 13a of back surface 12 of light flux controlling member 4. Further, FIG. 16B shows that the operation of convex parts 13a of back surface 12 of light flux controlling member 4 works on beams incident from the oblique direction of 45 degrees. One of beams shown in FIG. 15B matches the beam indicated by line O-P1 in above FIG. 3, and one of beams shown in FIG. 16B matches the beam indicated by line O-P2 in above FIG. 3.

As shown in FIG. 14B, convex parts 13a are formed in back surface 12 of light flux controlling member 4. As shown in FIG. 14A, the direction of beam x parallel to convex parts 13a and the direction of beam orthogonal to convex parts 13a are assumed.

When light is incident from the direction orthogonal to convex parts 13a of back surface 12 of light flux controlling member 4 as shown in FIG. 15A, the incident angles of light incident on convex parts 13a vary as shown in FIG. 15B. Therefore, light incident on back surface 12 (i.e. the lens bottom surface) of light flux controlling member 4 is not concentrated and is emitted from light control/emission surface 11 of light flux controlling member 4 as scattered light.

Similarly, when light is incident from the oblique direction of 45 degrees on convex parts 13a of back surface 12 of light flux controlling member 4 as shown in FIG. 16A, incident angles of light incident on convex parts 13a vary as shown in FIG. 16B. Further, light is incident on convex parts 13a at an angle (at 45 degrees in this case), and therefore the incident angles of light in the height direction and the depth direction of FIG. 16B also vary. Therefore, light incident on back surface 12 (i.e. lens bottom surface) of light flux controlling member 4 is emitted from light control/emission surface 11 of light flux controlling member 4 as scattered light without being concentrated.

As explained above in detail, with the present embodiment, grid convex part 13 that is formed with a plurality of strips and that scatter light incident on the back surface of light flux controlling member 4 from light emitting element 3, is formed in back surface 12 of light flux controlling member 4. By this means, light incident on back surface 12 (i.e. lens bottom surface) of light flux controlling member 4 is scattered without being concentrated, and is emitted from light control/emission surface 11 in a wide range on the illuminated surface. As a result, as shown in FIG. 12A, it is possible to realize uniform illuminance by preventing unevenness in illuminance on the illuminated surface, and provide high quality of illumination.

Further, with the present embodiment, in case where gap ε is formed between the light emission surface of light emitting element 3 and back surface 12 of light flux controlling member 4 when light flux controlling member 4 is attached to substrate 18, light incident on back surface 12 (i.e. lens bottom surface) of light flux controlling member 4 is prevented from being concentrated closer to reference optical axis L. As described above, with the present embodiment, gap ε is allowed between the light emission surface of light emitting element 3 and back surface 12 of light flux controlling member 4, so that the excessive accuracy of attachment is not required. Consequently, with the present embodiment, cost is reduced because light emitting element 3 of general use can be used instead of an expensive light emitting element miniaturized to a size that can be accommodated inside concavity 14.

For the same reason, with the present embodiment, in case where the entire area of back surface 12 of light flux controlling member 4 becomes an incidence plane, it is possible to provide high quality of illumination. Further, with the present embodiment, it is possible to provide a quality illuminated surface even if a light flux controlling member is arranged in a position the predetermined dimension apart from a light emitting element, and suppress negative influences caused by heat discharged by the light emitting element.

Embodiment 2

[Overall Shape of Light Flux Controlling Member]

Figure 17A:
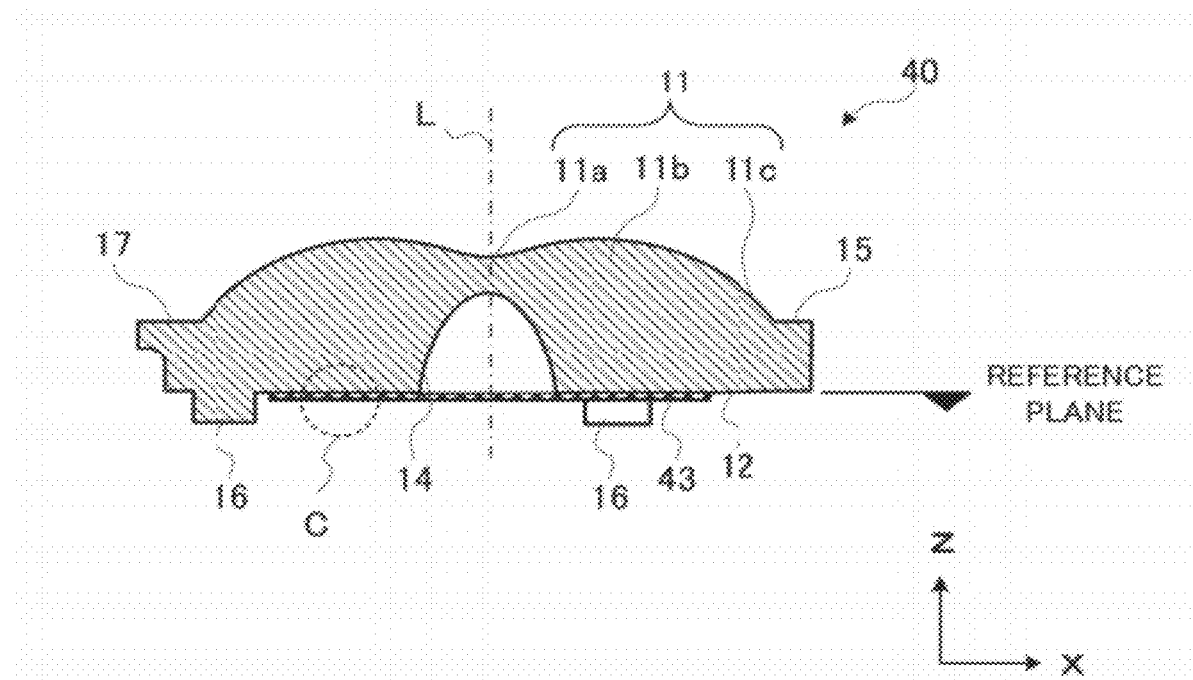
FIG. 17 is a cross-sectional view of a light flux controlling member of a light emitting apparatus according to Embodiment 2 of the present invention.
Figure 17B:
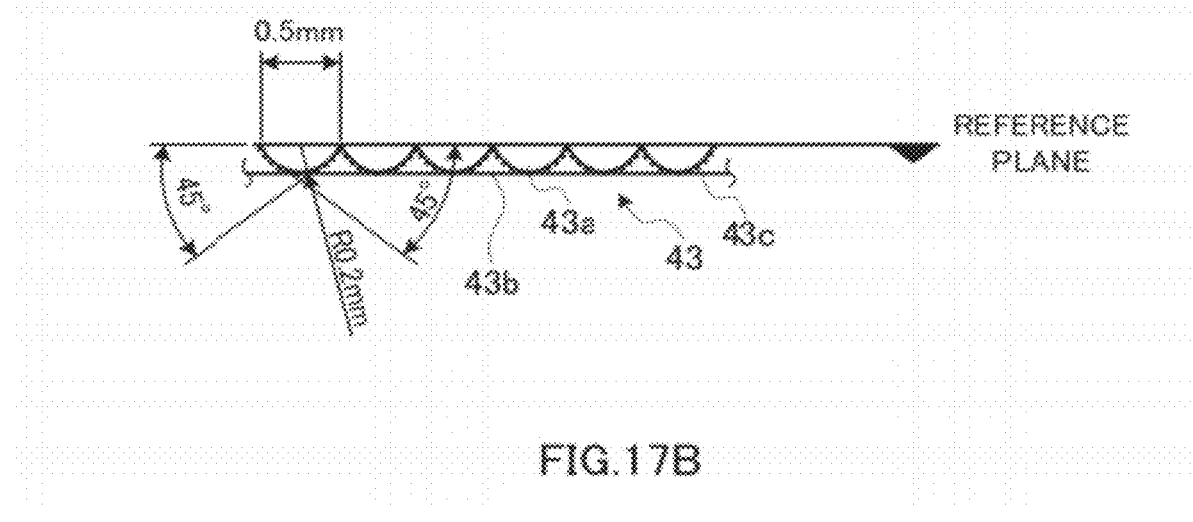

FIG. 17 is a cross-sectional view of a light flux controlling member of a light emitting apparatus according to Embodiment 2. FIG. 17A is a cross-sectional view of a light flux controlling member, and FIG. 17B is a view enlarging part C shown in FIG. 17A. In FIG. 17, the same components as in FIG. 7 will be assigned the same reference numerals, and explanation thereof will be omitted.

Light flux controlling member 40 is used instead of light flux controlling member 4 of FIG. 4 and FIG. 11.

In comparison of light flux controlling member 40 shown in FIG. 17A with light flux controlling member 4 shown in FIG. 7A, the shape of grid convex part 43 differs from the shape of grid convex part 13.

Grid convex part 43 is transferred from the mold using transparent resin material such as PMMA, PC and EP, to back surface 12 of light flux controlling member 40, and is formed integrally with light flux controlling member 40.

Figure 18:
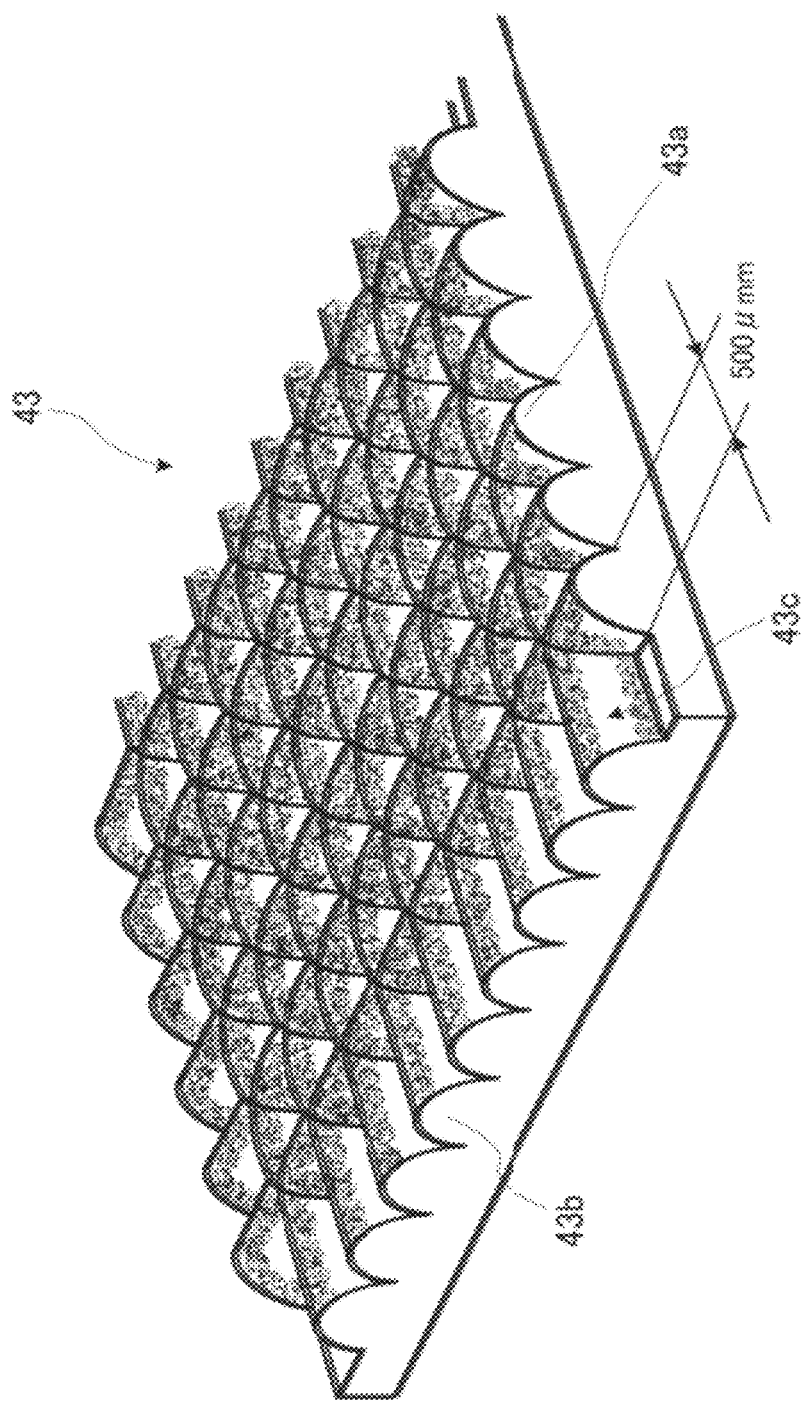
FIG. 18 is a perspective view schematically showing the structure of a grid convex part by cutting part of the back surface of a light emitting apparatus according to Embodiment 2 of the present invention.

As shown in FIG. 17B and FIG. 18, grid convex part 43 is formed by aligning a plurality of strips of convex parts 43a projecting outward from back surface 12 of light flux controlling member 40, such that the ridge lines of these convex parts 43a become parallel, and by aligning a plurality of strips of convex parts 43b orthogonal to those convex parts 43a, such that the ridge lines of these convex parts 43b become parallel. Then, concave parts are formed between convex parts 43a and convex parts 43a that are adjacent and between convex parts 43b and convex parts 43b that are adjacent. Minute irregular surfaces 43c are formed in the surfaces of concave parts 43a and concave parts 43b.

FIG. 18 is a perspective view schematically showing the structure of a grid convex part by cutting part of grid convex part 43, and corresponds to FIG. 9.

As shown in FIG. 18, grid convex part 43 is formed by making a plurality of convex parts 43a and a plurality of convex parts 43b of virtually a semi-circular cross-sectional shape orthogonal to each other. By forming the above convex parts in a grid pattern, it is possible to scatter light incident on back surface 12 of light flux controlling member 40 in either the vertical direction or the horizontal direction.

The cross-sectional shape of convex part 43a has a similar shape to a semi-circle. For example, the length of the bottom surface of convex part 43a is 0.5 millimeters, the base angle is 45 degrees and R at the tip is 0.2 millimeters. A shape is possible where the inclining angle of convex part 43a may be equal to or greater than 45 degrees or may be smaller than 45 degrees. The inclining angle of convex part 43a is preferably 45 degrees or greater for the purpose of appropriately scattering light incident on back surface 12 of light flux controlling member 40.

Fine irregular surface 43c is a rough surface of about 70 micrometers formed on the surface of convex part 43a. Fine irregular surfaces 43c are created by performing etching processing to roughen the mold in which convex parts 43a are formed.

As described above, with the present embodiment, by forming convex part 43 in back surface 12 of light flux controlling member 40, it is possible to appropriately scatter light incident on back surface 12 of light flux controlling member 40, and, by forming the surfaces of convex parts 43a and convex parts 43b as fine irregular surface 43c, it is possible to improve scattering performance and further prevent unevenness in illuminance.

Embodiment 3

[Overall Shape of Light Flux Controlling Member]

With above Embodiments 1 and 2, inventions for scattering light incident on back surface 12 by providing grid convex part 13 (43) in back surface 12 of light flux controlling member 4 (40) have been explained.

The present inventors have found that, by devising the shape of grid convex part 13, it is possible to provide advantages of retroreflecting light reflected by light diffusing member 2 and increasing the amount of retroreflected light.

The invention as to the shape of grid convex part 13 for increasing the amount of retroreflected light will be explained with Embodiment 3.

Figure 19A:
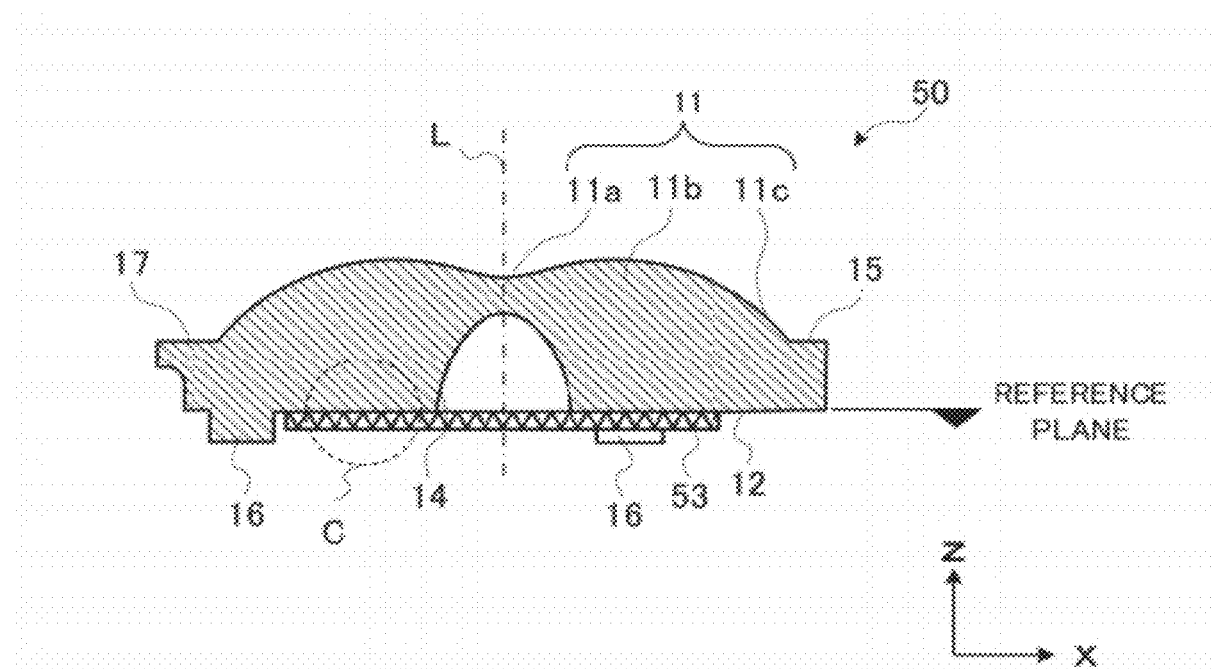
FIG. 19 is a cross-sectional view of a light flux controlling member of a light emitting apparatus according to Embodiment 3 of the present invention.
Figure 19B:
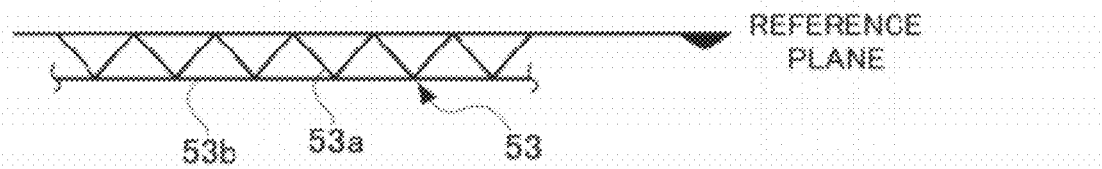

FIG. 19 is a cross-sectional view of a light flux controlling member of a light emitting apparatus according to the present embodiment. FIG. 19A is an overall cross-sectional view of a light flux controlling member, and FIG. 19B is a view enlarging part C shown in FIG. 19A. Note that, in FIG. 19, the same components as in FIG. 7 will be assigned the same reference numerals and explanation thereof will be omitted.

Light flux controlling member 50 is used instead of light flux controlling member 4 of FIG. 4 and FIG. 11.

In comparison of light flux controlling member 50 shown in FIG. 19A with light flux controlling member 4 shown in FIG. 7A, the shape of grid convex part 53 differs from the shape of grid convex part 13.

Grid convex part 53 is transferred from the mold using transparent resin material such as PMMA, PC and EP, to back surface 12 of light flux controlling member 50, and is formed integrally with light flux controlling member 50.

As shown in FIG. 19B, grid convex part 53 is formed by aligning a plurality of strips of convex parts 53a projecting outward from back surface 12 of light flux controlling member 50, such that the ridge lines of these convex parts 53a become parallel, and by aligning a plurality of strips of convex parts 53b orthogonal to those convex parts 53a, such that the ridge lines of these convex parts 53b become parallel. Then, square-pyramidal concave parts are formed between convex parts 53a and convex parts 53a that are adjacent and between convex parts 53b and convex parts 53b that are adjacent. The cross-sectional shapes of convex part 53a and convex part 53b orthogonal to the direction in which strips extend are isosceles triangles.

Here, grid convex part 53 only needs to be provided in a predetermined area from the center of back surface 12 of light flux controlling member 50 to the outer periphery, and may be formed in the entire surface of back surface 12 of light flux controlling member 50.

[Explanation of Convex Parts 53a of Grid Convex Parts 53 and Retroreflected Light]

Part of light emitted from light control/emission surface 11 of light flux controlling member 50 is reflected by light diffusing member 2 without transmitting through light diffusing member 2 (see FIG. 5). Part of light reflected by light diffusing member 2 is incident on light control/emission surface 11.

As shown in FIG. 19, by forming convex parts 53a of grid convex part 53 as isosceles triangles, light incident on light control/emission surface 11 is retroreflected by convex parts 53a and is emitted again from light control/emission surface 11.

Figure 20A:
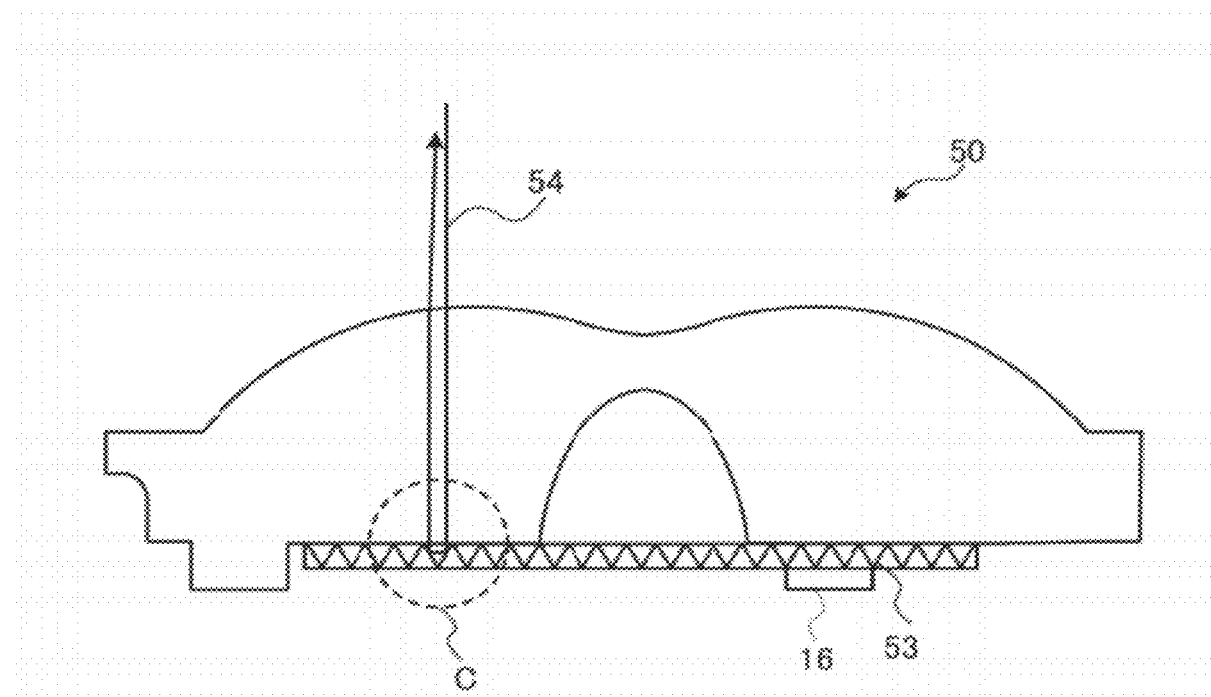
FIG. 20 illustrates how light is retroreflected on the back surface of a light flux controlling member of a light emitting apparatus according to Embodiment 3 of the present invention.
Figure 20B:
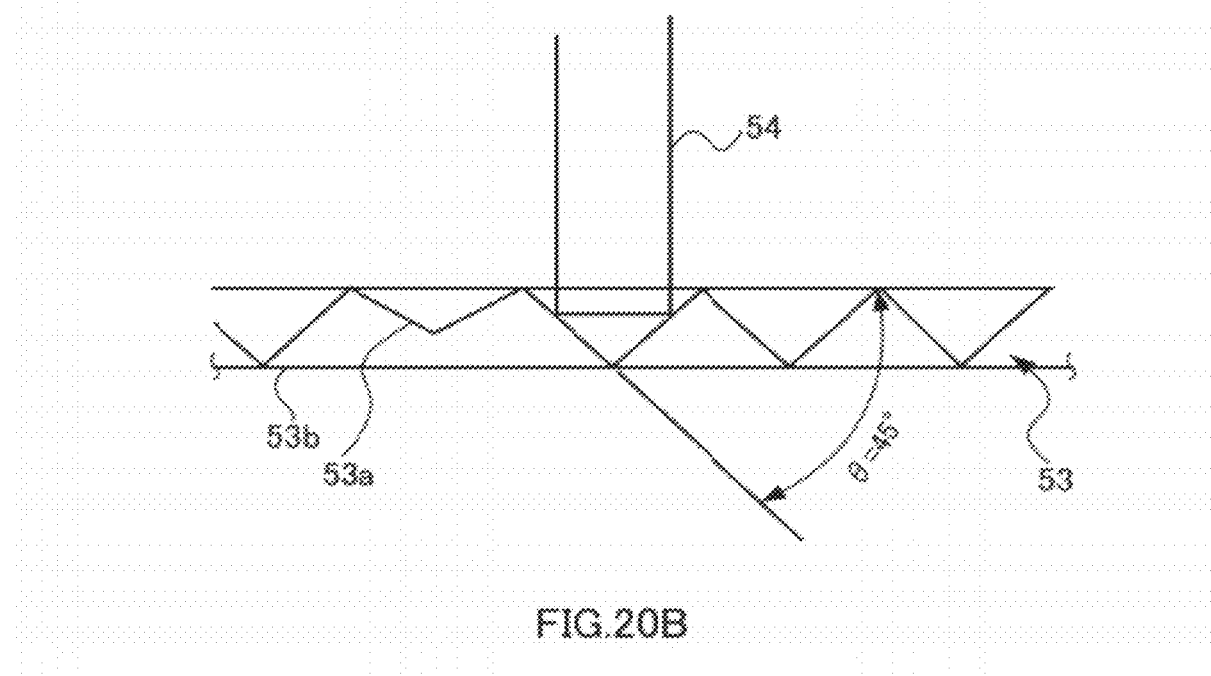
Figure 21A:
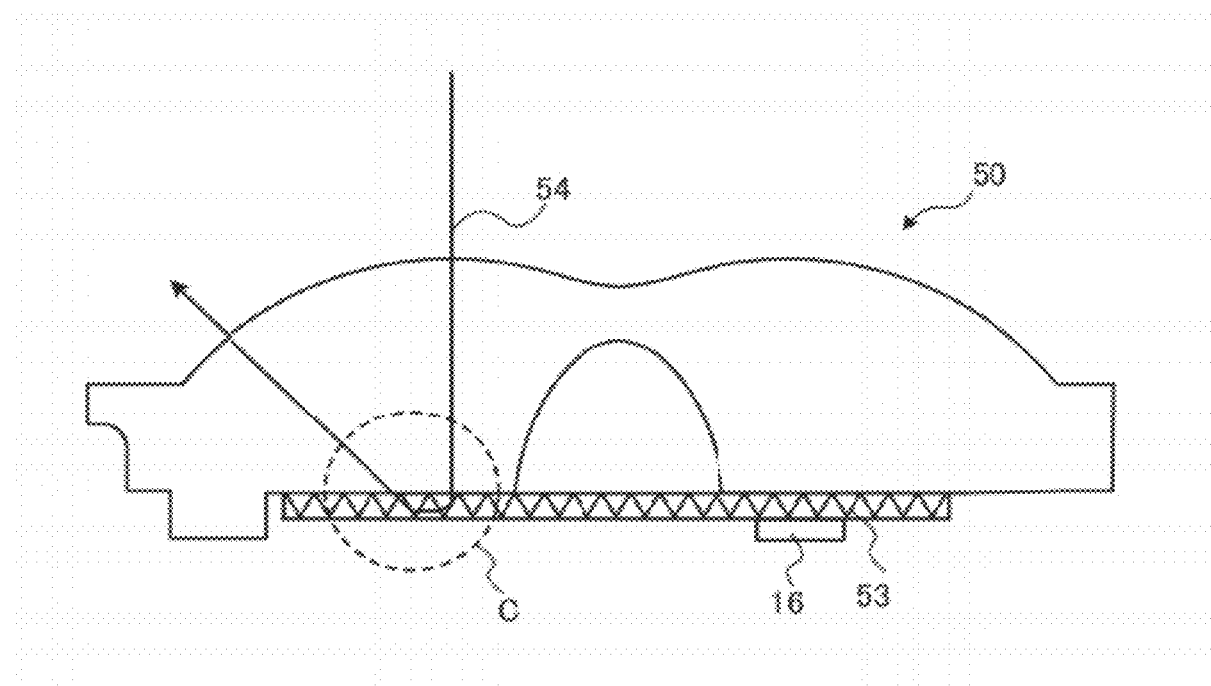
FIG. 21 illustrates how light is retroreflected on the back surface of a light flux controlling member of a light emitting apparatus according to Embodiment 3 of the present invention.
Figure 21B:
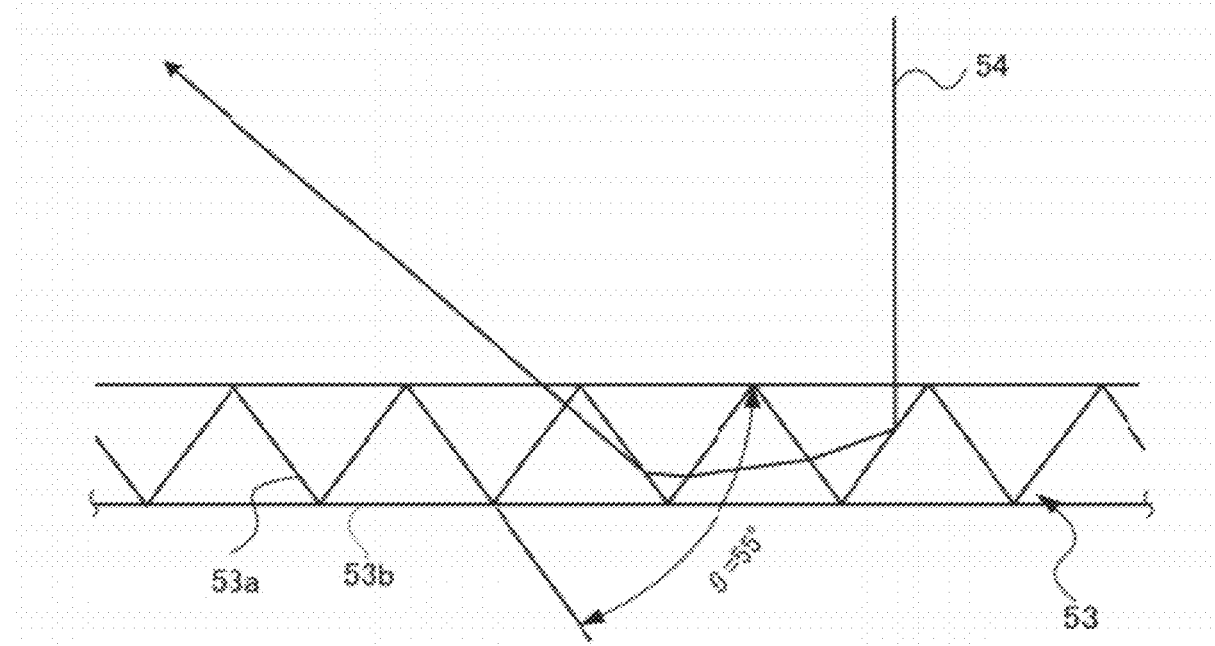

FIG. 20 and FIG. 21 show how light which is reflected by light diffusing member 2 and is incident on light control/emission surface 11 is retroreflected by convex parts 53a. FIG. 20 shows the case where inclining angle θ which is an angle formed between the bottom surface (i.e. reference surface) and the pyramid surface is 45 degrees, and FIG. 21 shows the case where inclining angle θ is 55 degrees. Further, FIG. 20B is a view enlarging part C shown in FIG. 20A, and FIG. 21B is a view enlarging part C shown in FIG. 21A.

As shown in FIG. 20, in case of θ=45 degrees, part of light 54 incident from the direction vertical to the reference plane is reflected totally inside one convex part 53a, and is emitted again from light control/emission surface 11.

By contrast with this, as shown in FIG. 21, in case of θ=55 degrees, part of light 54 incident on light control/emission surface 11 from the direction vertical to the reference plane reflects and refracts to pass between a plurality of convex parts 53a, and is emitted again from light control/emission surface 11.

Light reflected totally inside one convex part 53a is brighter than light emitted reflecting and refracting to pass between a plurality of convex parts 53a. That is, the amount of retroreflected light is great.

Note that, in case of θ=45 degrees, light incident from directions other than the direction vertical to the reference plane includes light emitted reflecting and refracting to pass between a plurality of convex parts 53a. Accordingly, it is not necessarily appropriate to say that the amount of retroreflected light is the greatest in case of θ=45 degrees.

[Simulation Result]

Figure 22:
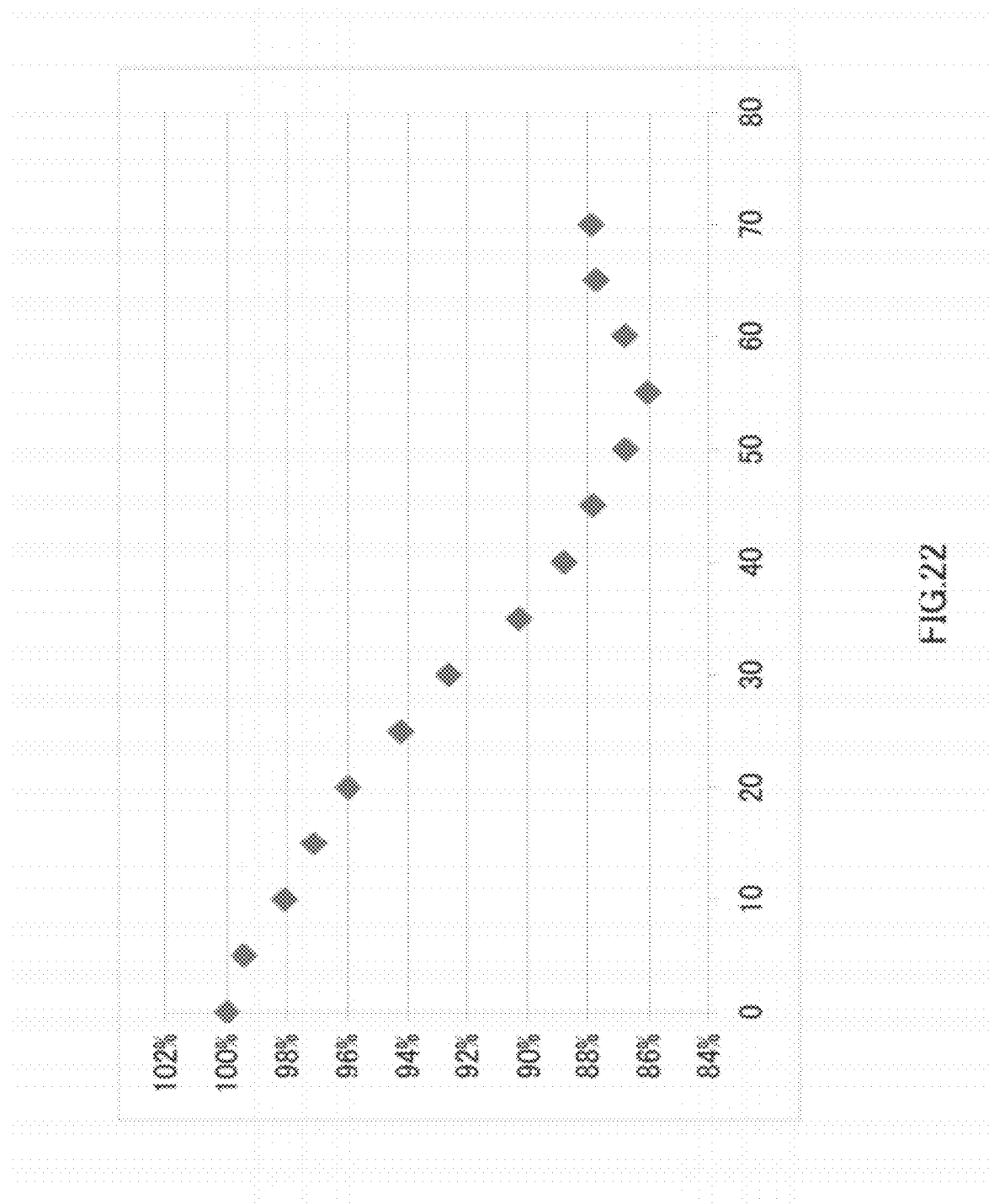
FIG. 22 shows the result of simulation to verify advantages of a light emitting apparatus according to Embodiment 3 of the present invention.

The present inventors conducted a simulation about the relationship between inclining angle θ and the amount of retroreflected light to verity the advantage of the present embodiment. FIG. 22 shows this simulation result.

The horizontal axis of FIG. 22 indicates inclining angle θ. Further, the vertical axis of FIG. 22 represents the rate of the amount of light reaching surface 18a (i.e. light receiving surface) of substrate 18 in case where the inclining angle is θ degree (that is, the back surface 12 has a planar surface).

That is, when the value on the vertical axis of FIG. 22 is smaller, the amount of retroreflected light is greater. As shown in FIG. 22, the simulation found that the amount of retroreflected light maximized when inclining angle θ was about 55 degrees.

[Variation]

Further, as shown in above FIG. 10, the amount of light incident on back surface 12 is greater in a part closer to light emitting element 3.

Figure 23:
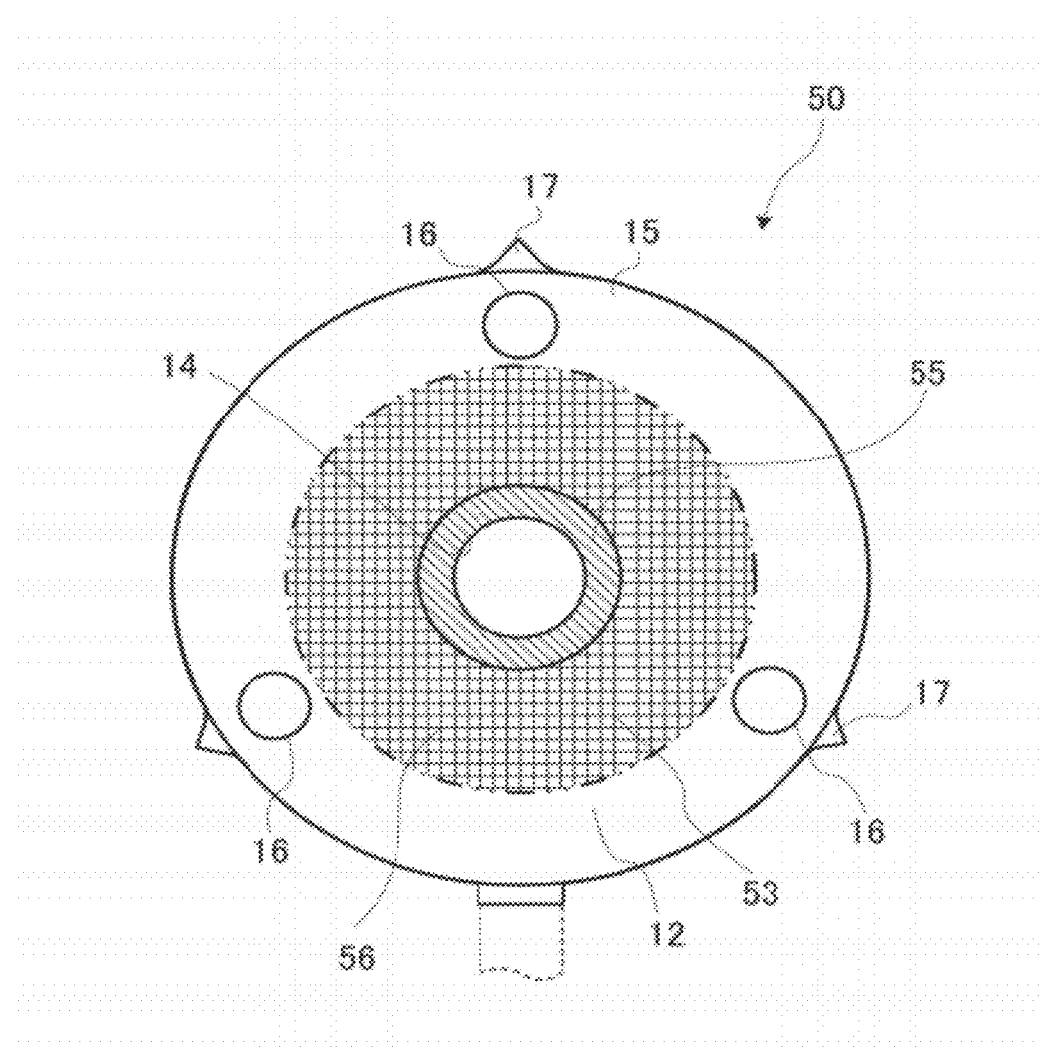
FIG. 23 shows variation of a light flux controlling member of a light emitting apparatus according to Embodiment 3 of the present invention.

As shown in FIG. 23, it is equally possible to apply treatment (e.g. engraving treatment) mainly for the purpose of scattering light, in area 55 a predetermined distance apart from the center of back surface 12, and apply treatment (treatment for providing grid convex part 53) mainly for the purpose of retroreflection, in other area 56 of back surface 12. In this way, by forming a light scattering part in area 55 (i.e. inner area) in which light from light emitting element 3 frequently enters and which is near the periphery of concavity 14 and by forming a retroreflecting part in area 56 (i.e. outer area) which is distant from concavity 14 on back surface 12 and which light from light emitting element 3 hardly reaches, it is possible to effectively realize two functions of scattering and retroreflecting light.

As described above, with the present embodiment, by forming grid convex part 53 formed with convex parts 53a and convex parts 53b having isosceles-triangular cross-sectional shape, in back surface 12 of light flux controlling member 50, it is possible to effectively utilize light reflected by light diffusing member 2 by retroreflecting this light to illuminate light diffusing member 2 again, so that it is possible to reduce the amount of decrease in luminance on a display surface.

There are cases where reflective sheets are installed above surface 18a of substrate 18 of the display apparatus in order to reduce the amount of decrease in luminance on the display screen. With the present embodiment, light retroreflected by light flux controlling member 50 transmits through light diffusing member 2 and is radiated on the display screen (i.e. illuminated surface), so that it is possible to prevent unevenness in luminance on the display screen without placing reflective sheets under light emitting apparatuses 5 in substrate 18 and provide high quality of illumination.

Embodiment 4

A case will be explained with Embodiment 4 where a grid pattern of a plurality of concave parts is formed in the back surface of a light flux controlling member.

Figure 24A:
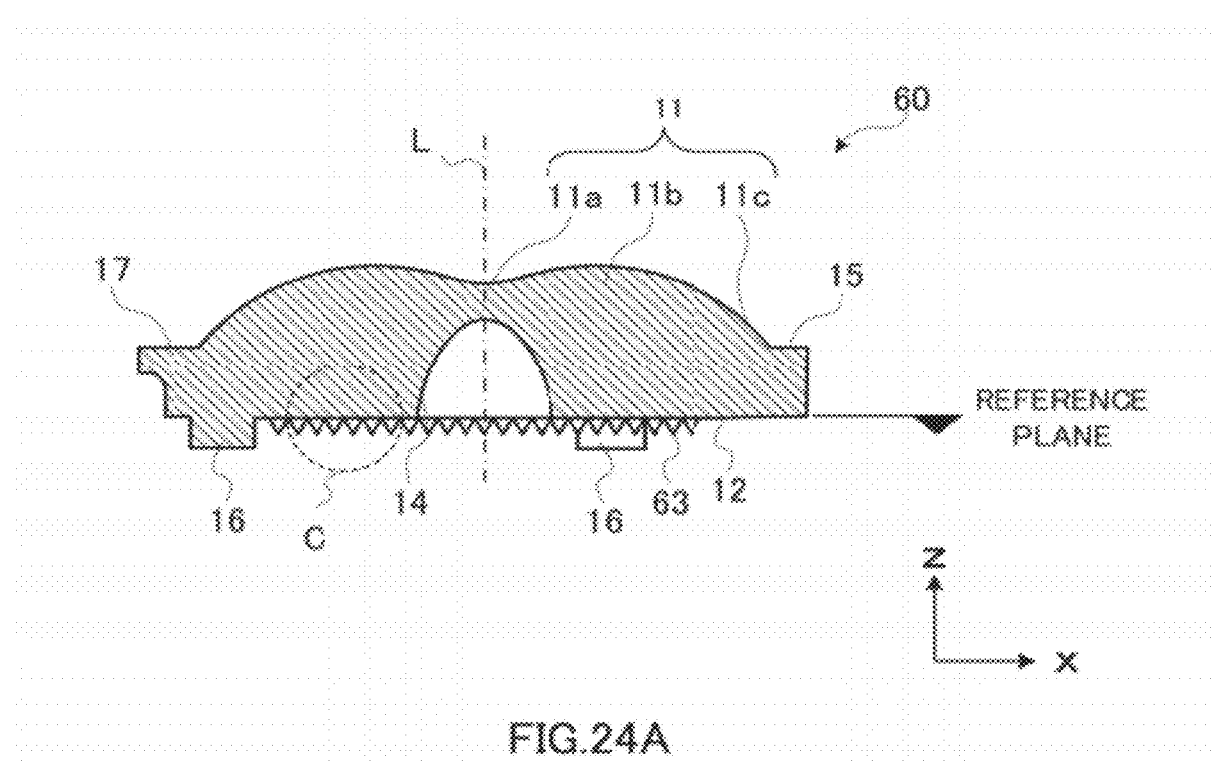
FIG. 24 is a cross-sectional view of a light flux controlling member of a light emitting apparatus according to Embodiment 4 of the present invention.
Figure 24B:
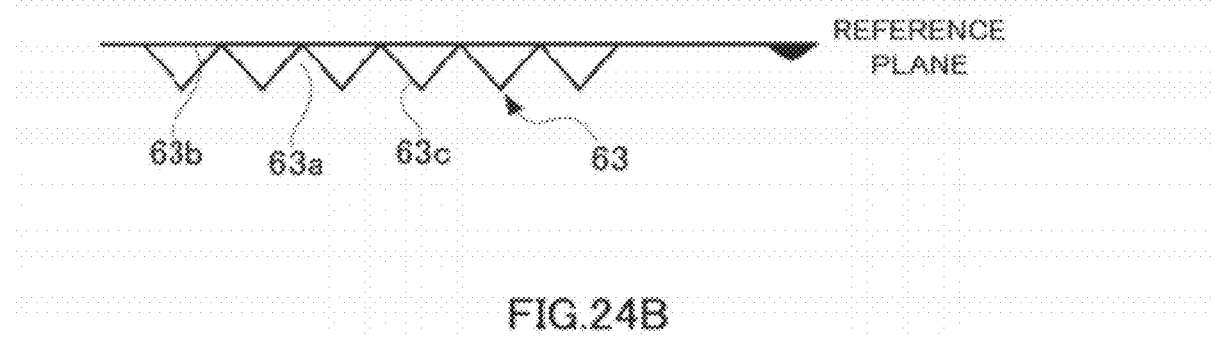

FIG. 24 is a cross-sectional view of a light flux controlling member of a light emitting apparatus according to the present embodiment. FIG. 24A is an overall cross-sectional view of a light flux controlling member, and FIG. 24B is a view enlarging part C shown in FIG. 24A. Note that, in FIG. 24, the same components as in FIG. 19 will be assigned the same reference numerals, and explanation thereof will be omitted.

Light flux controlling member 60 is used instead of light flux controlling member 50 of FIG. 19 to FIG. 23.

Light flux controlling member 60 shown in FIG. 24A differs from light flux controlling member 50 shown in FIG. 19A in providing grid concave part 63 instead of grid convex part 53. Concave parts 63a and concave parts 63b are formed instead of convex parts 53a and convex parts 53b of light flux controlling member 50.

Grid concave part 63 is formed by aligning a plurality of recessed strips of concave parts 63a, such that the ridge lines of these concave parts 63a become parallel, and by aligning a plurality of recessed strips of concave parts 63b orthogonal to those concave parts 63a, such that the ridge lines of these concave parts 63b become parallel. Then, square-pyramidal convex parts 63c are formed between concave parts 63a and concave parts 63a that are adjacent and between convex parts 63b and convex parts 63b that are adjacent.

A plurality of square-pyramids of convex parts 63c projecting outward from back surface 12 of light flux controlling member 60 are transferred from the mold using transparent resin material such as PMMA, PC and EP, and are formed integrally with light flux controlling member 60.

Note that grid concave part 63 only needs to be provided in a predetermined area from the center of back surface 12 of light flux controlling member 60 to the outer peripheral surface, or may be formed in the entire surface of back surface 12 of light flux controlling member 60.

The present embodiment can also scatter light incident from light emitting elements, on the back surface of the light controlling member.

Embodiment 5

Although cases have been explained with the above embodiments where a square grid pattern of a plurality of concave parts or a plurality of convex parts is formed in the back surface of the light flux controlling member, the present invention is not limited to this, and a triangular grid pattern or a hexagonal grid pattern of a plurality of concave parts or a plurality of convex parts may be formed.

Cases will be explained with Embodiment 5 where a triangular grid pattern or a hexagonal grid pattern of a plurality of concave parts or a plurality of convex parts is formed in the back surface of a light flux controlling member.

[Variation 1]

Figure 25A:
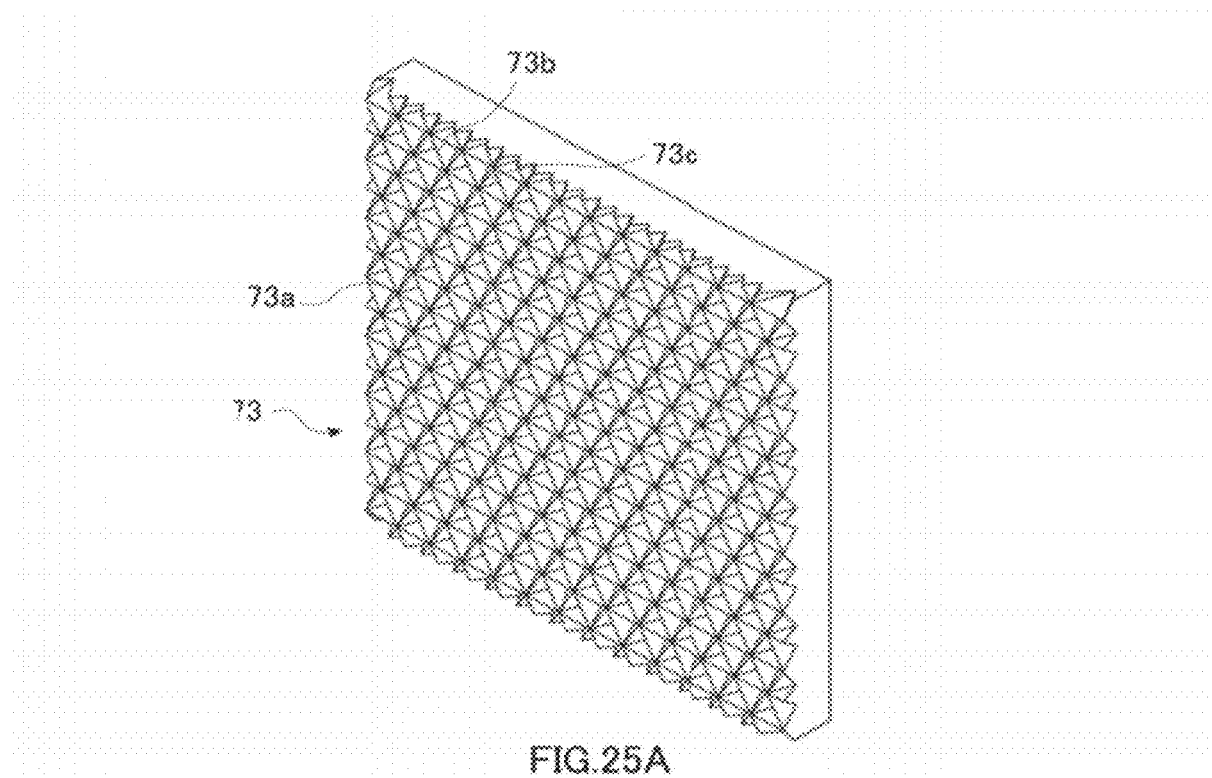
FIG. 25 schematically shows the structure of the grid concave-convex parts by cutting part of the back surface of the light flux controlling member of variation 1 of a light emitting apparatus according to Embodiment 5 of the present invention.
Figure 25B:
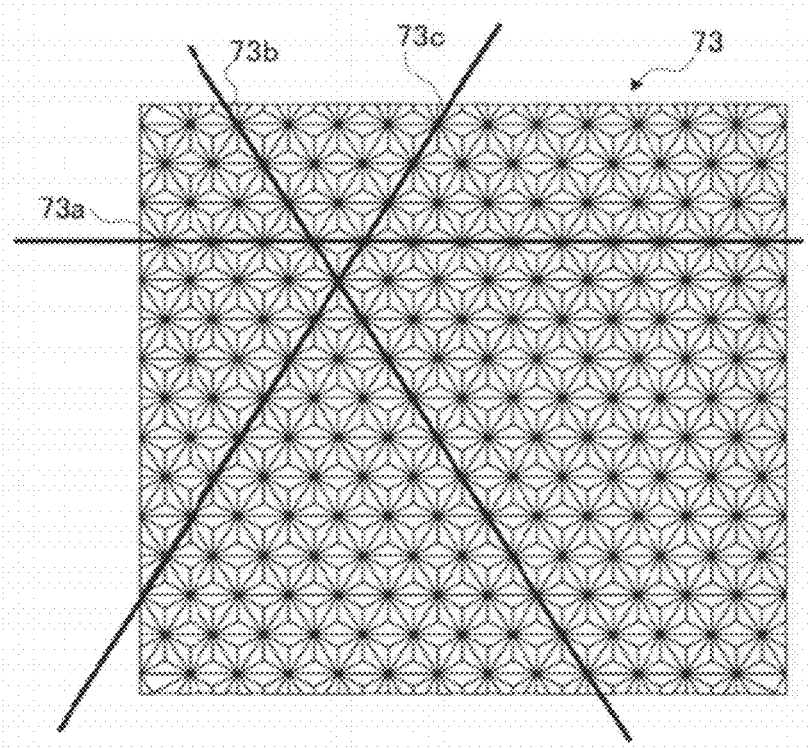
Figure 25C:
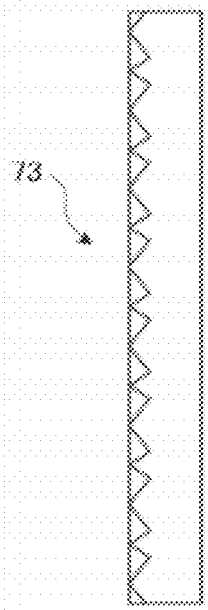

Variation 1 according to the present embodiment provides a case where a triangular grid pattern of a plurality of convex parts is formed in the back surface of a light flux controlling member. FIG. 25 schematically shows the structure of grid concave parts by cutting part of the back surface of the light flux controlling member of variation 1 of a light emitting apparatus according to the present embodiment. FIG. 25A is a perspective view, FIG. 25B is a bottom view and FIG. 25C is a side view.

As shown in FIG. 25, grid convex part 73 is formed by aligning a plurality of strips of convex parts 73a projecting outward from the back surface of the light flux controlling member, aligning a plurality of convex parts 73b such that 60 degrees are formed between convex parts 73b and convex parts 73a, and aligning convex parts 73c such that 60 degrees are formed between convex parts 73c, convex parts 73a and convex parts 73b. Moreover, triangular-pyramidal concave parts are formed in parts surrounded by convex parts 73a, convex parts 73b and convex parts 73c. The cross-sectional shapes of convex part 73a, convex part 73b and convex part 73c orthogonal to the direction in which strips extend are isosceles triangles.

[Variation 2]

Figure 26A:
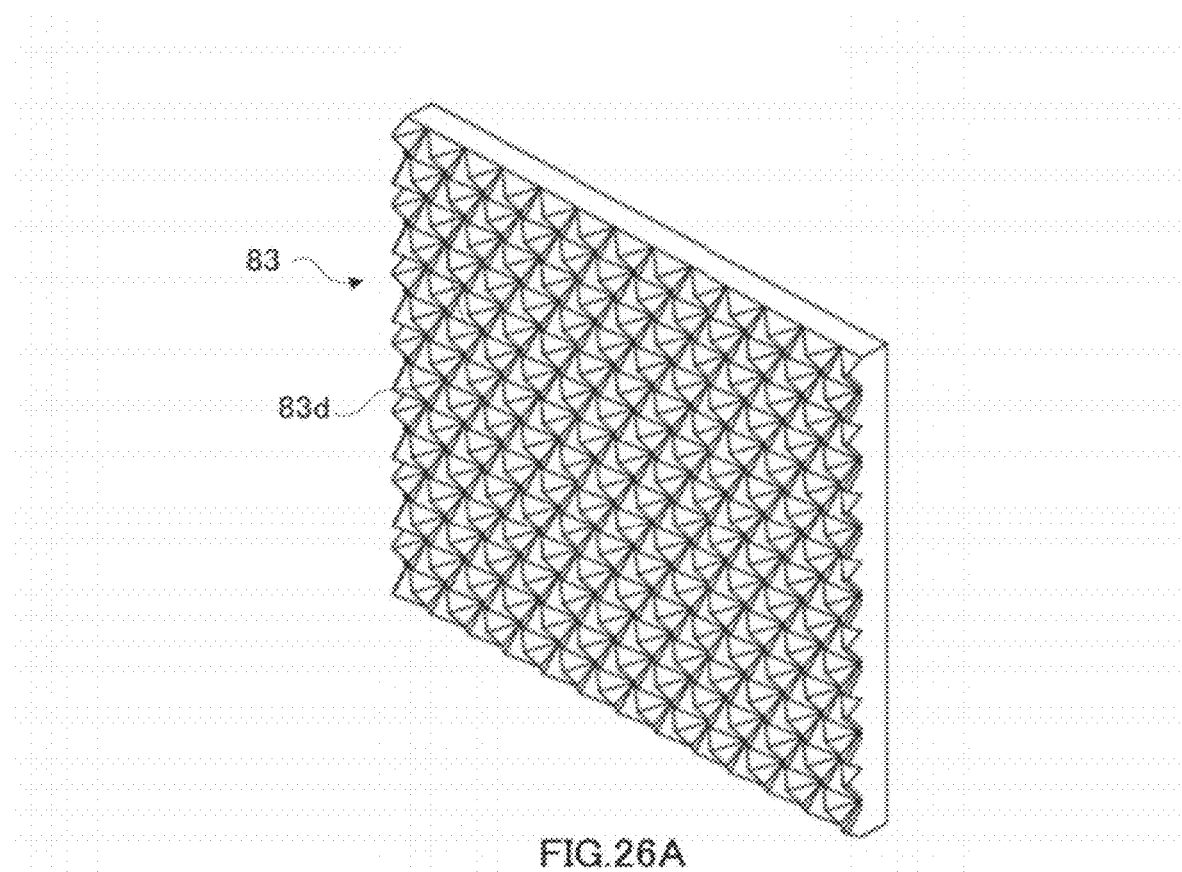
FIG. 26 schematically shows the structure of the grid concave part by cutting part of the back surface of the light flux controlling member of variation 2 of a light emitting apparatus according to Embodiment 5 of the present invention.
Figures 26B, 26C:
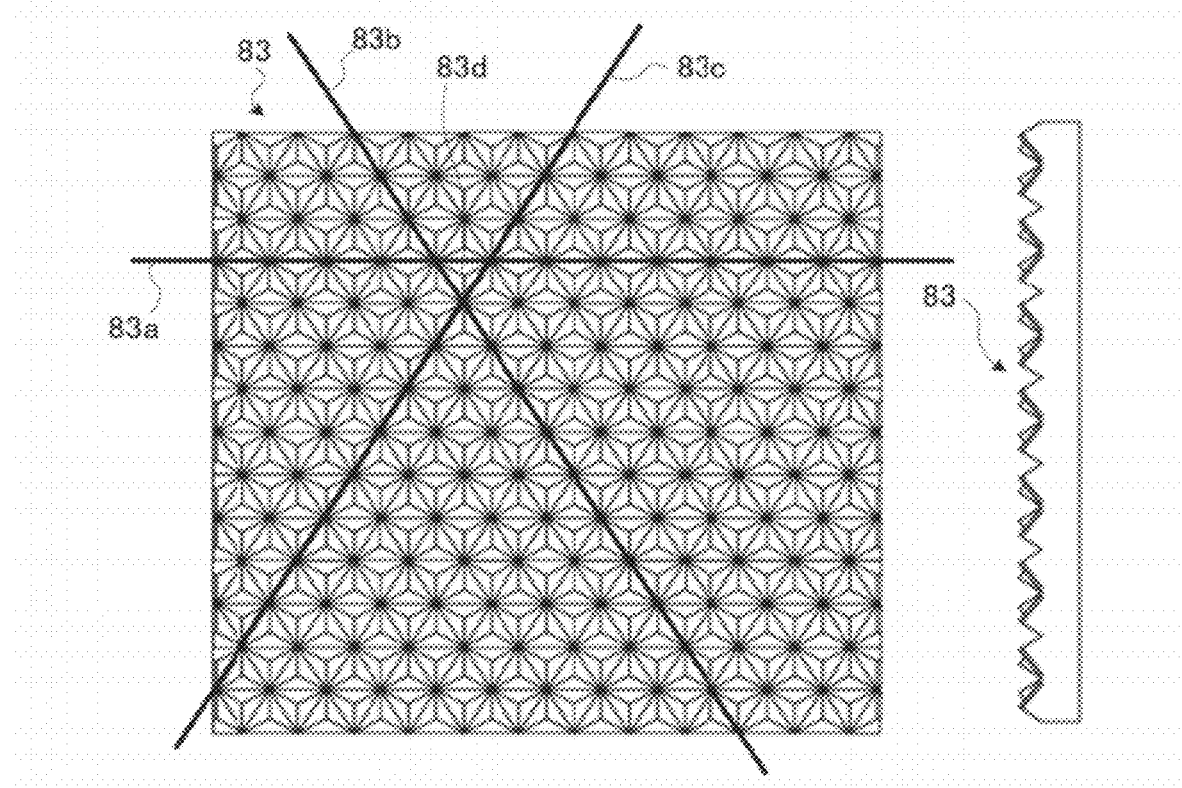

Variation 2 according to the present embodiment provides a case where a triangular grid pattern of a plurality of concave parts is formed in the back surface of the light flux controlling member. FIG. 26 schematically shows the structure of grid concave parts by cutting part of the back surface of a light flux controlling member of variation 2 of the light emitting apparatus according to the present embodiment. FIG. 26A is a perspective view, FIG. 26B is a bottom view and FIG. 26C is a side view.

As shown in FIG. 26, grid concave part 83 is formed with a plurality of triangular pyramids of convex parts 83d projecting outward from the back surface of the light flux controlling member. In a triangular grid in which a plurality of concave parts 83a, a plurality of concave parts 83b and a plurality of concave parts 83 are formed to cross at 60 degrees, these triangular-pyramidal concave parts 83d are formed in parts surrounded by concave parts 83a, concave parts 83b and concave parts 83c.

[Variation 3]

Figure 27:
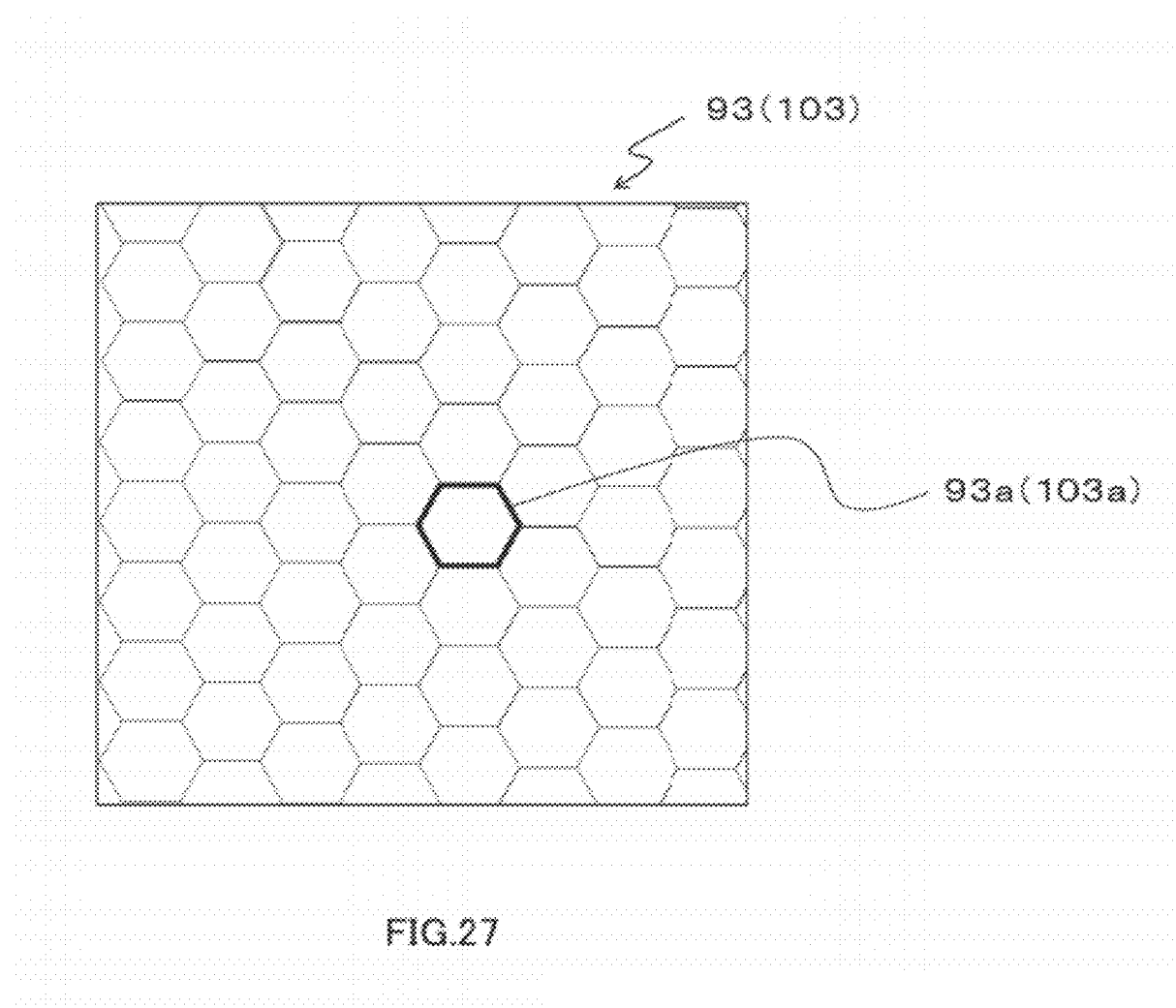
FIG. 27 schematically shows the structure of the grid concave-convex part by cutting part of the back surface of the light flux controlling member of variation 3 of a light emitting apparatus according to Embodiment 5 of the present invention.

Variation 3 according to the present embodiment provides a case where a hexagonal grid pattern of a plurality of convex parts is formed in the back surface of a light flux controlling member. FIG. 27 is a bottom view schematically showing the structure of grid concave parts by cutting part of the back surface of the light flux controlling member of variation 3 of the light emitting apparatus according to the present embodiment.

As shown in FIG. 27, grid concave part 93 is formed by arranging a hexagonal grid pattern of ridge lines of a hexagon (i.e. bold concave part 93a indicated in FIG. 27), in the back surface of the light flux controlling member. Moreover, hexagonal-pyramidal concave parts surrounded by hexagonal concave parts 93a are formed.

[Variation 4]

Variation 4 according to the present embodiment provides a case where a hexagonal grid pattern of a plurality of concave parts is formed in the back surface of a light flux controlling member. In the light flux controlling member according to variation 4, a hexagonal groove (i.e. bold concave part 103a of FIG. 27) is formed instead of hexagonal convex part 93a according to above-described variation 3.

Grid concave parts 103a are formed by arranging a hexagonal grid pattern of hexagonal grooves (i.e. concave parts) 103a, in the back surface of a light flux controlling member. Then, hexagonal-pyramidal concave parts surrounded by hexagonal concave parts 103a are formed.

With each variation according to the present embodiment, it is possible to scatter light incident on the back surface of a light controlling member from light emitting elements.

Note that, as in Embodiment 1, Embodiment 2, Embodiment 3 and variation 1 according to Embodiment 5, processing a mold is easy when strips are formed in a product (i.e. light flux controlling member).

The above explanation is an illustration of preferable embodiments of the present invention, and the scope of the present invention is not limited to these.

For example, a light diffusing member may be attached to the surface on the light emitting element side of a member-to-be-illuminated, or may be arranged on the side of the surface facing the light emitting element of the member-to-be-illuminated in a state where the light diffusing member is provided separately from the member-to-be-illuminated.

Further, the light flux controlling member may form an engraved surface in a light control/emission surface to diffuse light emitted from the light control/emission surface.

Furthermore, the light flux controlling member may be made of material including light diffusion material (for example, silicon particles and oxidized titanium).

Still further, although the names "light emitting apparatus," "surface light source apparatus," and "display apparatus" have been used with the above embodiments for ease of explanation, names such as "planar light source" and "display element" are equally possible.

INDUSTRIAL APPLICABILITY

The light emitting apparatus, surface light source apparatus and display apparatus according to the present invention can be widely used for various illuminations in, for example, television monitors, backlights of monitors of personal computers and interior lights.

REFERENCE SIGNS LIST

1 SURFACE LIGHT SOURCE APPARATUS
2 LIGHT DIFFUSING MEMBER
3 LIGHT EMITTING ELEMENT
4, 40, 50 LIGHT FLUX CONTROLLING MEMBER
5 LIGHT EMITTING APPARATUS
6 DISPLAY APPARATUS
7 MEMBER-TO-BE-ILLUMINATED
11 LIGHT CONTROL/EMISSION SURFACE
12 BACK SURFACE
13, 43, 53, 73, 93 GRID CONCAVE PART
13a, 13b, 43a, 43b, 53a, 53b, 73a, 73b, 93a CONVEX PART
14 CONCAVITY
15 FLANGE
16 LEG
18 SUBSTRATE
43c IRREGULAR SURFACE
63, 83, 103 GRID CONCAVE PART
63a, 83a, 83b, 83c, 103a CONCAVE PART
93a RIDGE LINE

The invention claimed is:

1. A light emitting apparatus comprising:
a light emitting element that is arranged on a substrate and that emits light; and
a light flux controlling member that comprises:
a light control/emission surface that controls a traveling direction of light emitted from the light emitting element;
a concavity that allows a main beam to be incident inside, the main beam being light emitted in a predetermined range of an angle from a reference optical axis serving as a center axis of three-dimensional light fluxes emitted from the light emitting element; and
a back surface that extends in a radial direction from an opening rim part of the concavity and that allows sub-beams to be incident inside, the sub-beams being light other than the main beam emitted from the light emitting element, wherein:
one of a grid convex part which arranges a plurality of strips of convex parts in a grid pattern and a grid concave part which arranges a plurality of strips of concave parts in a grid pattern, is formed in the back surface of the light flux controlling member; and
the substrate on which the light emitting element is arranged and the back surface of the light flux controlling member are placed opposite to one another without intervention of a reflective sheet therebetween.

2. The light emitting apparatus according to claim 1, wherein the grid pattern is a square grid.

3. The light emitting apparatus according to claim 1, wherein the grid pattern is a triangular grid.

4. The light emitting apparatus according to claim 1, wherein the grid pattern is a hexagonal grid.

5. The light emitting apparatus according to claim 1, wherein one of the grid convex part and the grid concave part is integrally molded with the back surface of the light flux controlling member.

6. The light emitting apparatus according to claim 1, wherein one of the strips of the convex parts and the strips of the concave parts each comprise a cross-sectional shape that is orthogonal to a direction in which the strips extend and that comprises one of a triangular shape, a triangular shape having a vertex subjected to R-chamfer processing, and a semi-circular shape.

7. The light emitting apparatus according to claim 1, wherein a groove part between the strips of the convex parts comprises a round shape.

8. The light emitting apparatus according to claim 1, wherein surface roughening treatment is applied to one of the strips of the convex parts and the strips of the concave parts.

9. The light emitting apparatus according to claim 1, wherein the strips of the convex parts comprise a triangular cross-sectional shape that is orthogonal to a direction in which the strips of the convex parts project, and an inclining angle of 55 degrees that is an angle formed between a bottom side and another side.

10. A surface light source apparatus comprising:
the light emitting apparatus according to claim 1; and
a light diffusing member that scatters light and allows transmission of light emitted from the light emitting apparatus.

11. A display apparatus comprising:
the surface light source apparatus according to claim 10; and
a member-to-be-illuminated on which light from the surface light source apparatus is radiated.

12. A light emitting apparatus comprising:
a light emitting element that is arranged on a substrate and emits light as a point light source comprising a main beam and sub-beams; and
a light flux controlling member that comprises:
a light control/emission surface that controls a traveling direction of light emitted from the light emitting element;
a concavity that allows the main beam to enter the light flux controlling member, the main beam being light emitted in a predetermined range of an angle from a reference optical axis serving as a center axis of three-dimensional light fluxes emitted from the light emitting element; and
a back surface that extends in a radial direction from an opening rim part of the concavity and that allows the sub-beams to enter the light flux controlling member, the sub-beams being light other than the main beam emitted from the light emitting element, wherein:
one of a grid convex part, which arranges a plurality of strips of convex parts in a grid pattern, and a grid concave part, which arranges a plurality of strips of concave parts in a grid pattern, is formed in the back surface of the light flux controlling member and scatters the sub-beams; and
the substrate on which the light emitting element is arranged and the back surface of the light flux controlling member are placed opposite to one another without intervention of a reflective sheet therebetween.

* * * * *